(12) United States Patent
Rajagopalan et al.

(10) Patent No.: US 9,617,654 B2
(45) Date of Patent: Apr. 11, 2017

(54) LOW FRICTION COATINGS WITH IMPROVED ABRASION AND WEAR PROPERTIES AND METHODS OF MAKING

(71) Applicant: ExxonMobil Research and Engineering Company, Annandale, NJ (US)

(72) Inventors: Srinivasan Rajagopalan, Easton, PA (US); Tabassumul Haque, Annandale, NJ (US); Mehmet Deniz Ertas, Bethlehem, PA (US); Adnan Ozekcin, Bethlehem, PA (US); HyunWoo Jin, Easton, PA (US); Bo Zhao, Houston, TX (US)

(73) Assignee: EXXONMOBIL RESEARCH AND ENGINEERING COMPANY, Annandale, NJ (US)

( * ) Notice: Subject to any disclaimer, the term of this patent is extended or adjusted under 35 U.S.C. 154(b) by 309 days.

(21) Appl. No.: 13/724,403

(22) Filed: Dec. 21, 2012

(65) Prior Publication Data
US 2014/0178637 A1   Jun. 26, 2014

(51) Int. Cl.
*C25F 3/16* (2006.01)
*C23C 28/04* (2006.01)
(Continued)

(52) U.S. Cl.
CPC .............. *C25F 3/16* (2013.01); *C23C 14/024* (2013.01); *C23C 14/0605* (2013.01);
(Continued)

(58) Field of Classification Search
CPC ....... C23C 16/26; C23C 28/42; C23C 28/046; C23C 14/024; C23C 28/347; C23C 28/322;
(Continued)

(56) References Cited

U.S. PATENT DOCUMENTS

| 4,665,996 A | 5/1987 | Foroulis et al. |
| 6,056,073 A | 5/2000 | Boulet |

(Continued)

FOREIGN PATENT DOCUMENTS

| CN | 1966429 A | 5/2007 |
| CN | 1743503 A | 5/2008 |

(Continued)

OTHER PUBLICATIONS

Chen, Xinchun; Peng, Zhijian; Fu, Zhiqiang; Wang, Chengbiao; "Cr-doped DLC Multilayered Thin Films Deposited Using Cathodic Vacuum Arc- and DC Magnetron-assisted Ion Beam Sputtering", School of Engineering and Technology, China University of Geosciences, Beijing, 100083, Peop. Rep. China Source: Advanced Materials Research (Zuerich, Switzerland) (2010), 105-106 (Chinese Ceramics Communications), 429-431 CODEN: AMREFI.

(Continued)

*Primary Examiner* — Nathan Van Sell
(74) *Attorney, Agent, or Firm* — Robert A. Migliorini; Chad A. Guice

(57) ABSTRACT

Provided are low friction coatings with improved abrasion, wear resistance and methods of making such coatings. In one form, the coating includes: i) an under layer selected from the group consisting of CrN, TiN, TiAlN, TiAlVN, TiAlVCN, TiSiN, TiSiCN, TiAlSiN and combinations thereof, wherein the under layer ranges in thickness from 0.1 to 100 μm, ii) an adhesion promoting layer selected from the group consisting of Cr, Ti, Si, W, CrC, TiC, SiC, WC, and combinations thereof, wherein the adhesion promoting layer ranges in thickness from 0.1 to 50 μm and is contiguous with a surface of the under layer, and iii) a functional layer selected from the group consisting of a fullerene based composite, a diamond based material, diamond-like-carbon and combinations thereof, wherein the functional layer (Continued)

ranges from 0.1 to 50 μm and is contiguous with a surface of the adhesion promoting layer.

39 Claims, 1 Drawing Sheet

(51) Int. Cl.
*E21B 10/00* (2006.01)
*E21B 17/00* (2006.01)
*C23C 14/02* (2006.01)
*C23C 16/26* (2006.01)
*C23C 28/00* (2006.01)
*C23C 14/06* (2006.01)
*C23C 16/02* (2006.01)

(52) U.S. Cl.
CPC .......... *C23C 16/0272* (2013.01); *C23C 16/26* (2013.01); *C23C 28/044* (2013.01); *C23C 28/046* (2013.01); *C23C 28/322* (2013.01); *C23C 28/343* (2013.01); *C23C 28/347* (2013.01); *C23C 28/42* (2013.01); *E21B 10/00* (2013.01); *E21B 17/00* (2013.01); *Y10T 428/24355* (2015.01); *Y10T 428/24975* (2015.01)

(58) Field of Classification Search
CPC .............. C23C 28/044; C23C 16/0272; C23C 14/0605; C23C 28/343; E21B 17/00; E21B 10/00; E21B 17/042; E21B 41/00; E21B 17/1085; C25F 3/16; Y10T 428/24355; Y10T 428/24975
USPC .................................. 428/141–150; 204/192
See application file for complete search history.

(56) References Cited

U.S. PATENT DOCUMENTS

| | | | |
|---|---|---|---|
| 6,349,779 | B1 | 2/2002 | Gilbert |
| 7,182,160 | B2 | 2/2007 | Boulet |
| 8,220,563 | B2 | 7/2012 | Bangaru et al. |
| 8,261,841 | B2 | 9/2012 | Bailey et al. |
| 8,286,715 | B2 | 10/2012 | Bailey et al. |
| 2007/0284255 | A1* | 12/2007 | Gorokhovsky ....... C23C 14/024 205/89 |
| 2010/0206553 | A1 | 8/2010 | Bailey et al. |
| 2010/0210488 | A1 | 8/2010 | Suzuki et al. |
| 2011/0162751 | A1 | 7/2011 | Fitzgerald et al. |
| 2011/0203791 | A1 | 8/2011 | Jin et al. |
| 2011/0220348 | A1 | 9/2011 | Jin et al. |
| 2011/0220415 | A1 | 9/2011 | Jin et al. |

FOREIGN PATENT DOCUMENTS

| | | |
|---|---|---|
| JP | 2003268571 A | 9/2003 |
| JP | 2004169137 A | 6/2004 |
| WO | 2008003973 A1 | 1/2008 |

OTHER PUBLICATIONS

Kunitsugu, Shinsuke; Nomura, Hirorou; "Evaluation of Adhesions of DLC/CrN Multi-layered Coatings on Stainless Steel", Industrial Technology Center of Okayama Prefecture, Okayama, 701-1296, Japan Source: Hyomen Gijutsu (2009), 60(8), 527-532 CODEN: HYGIEX; ISSN: 0915-1869 Publisher: Hyomen Gijutsu Kyokai CA.
PCT Application No. PCT/US2013/070681, Communication from the Internationai Searching Authority, Form PCT/ISA/220, dated Feb. 24, 2014, 10 pages.

* cited by examiner

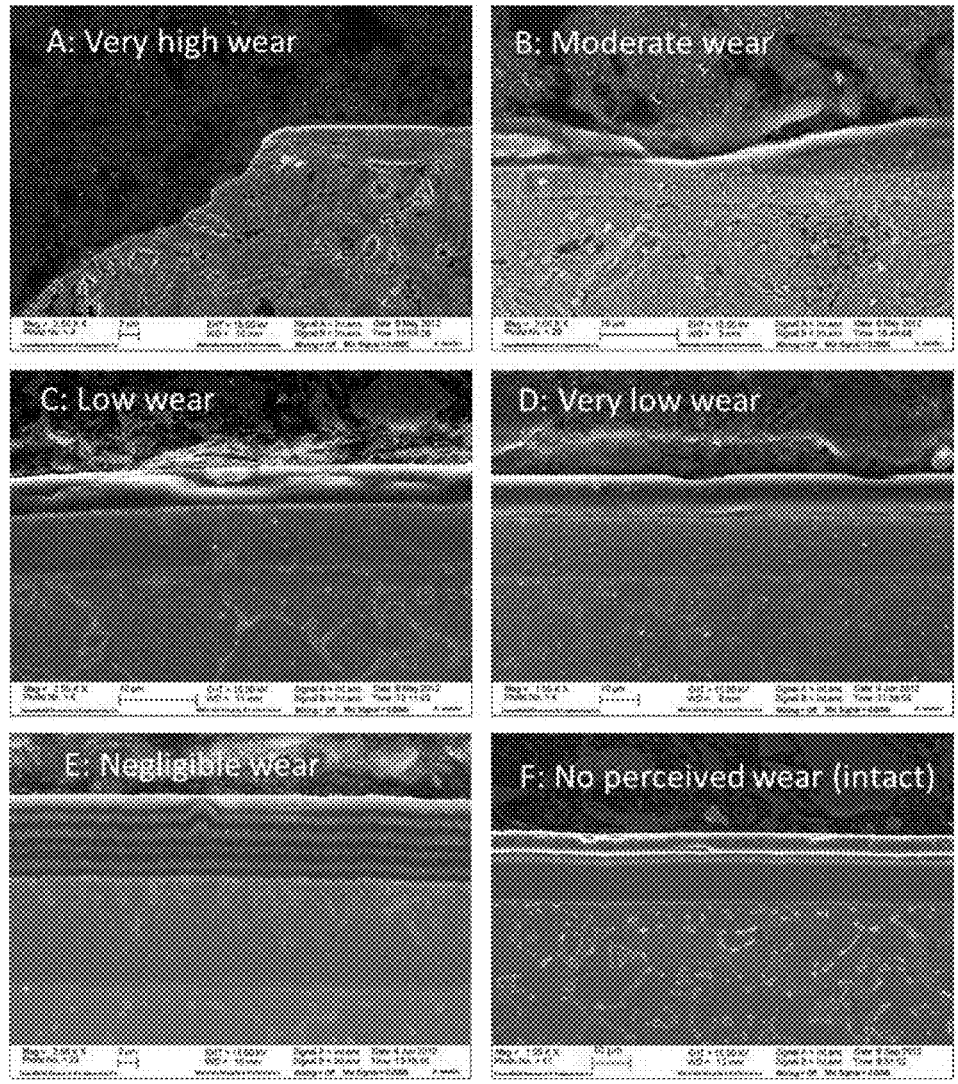

LOW FRICTION COATINGS WITH IMPROVED ABRASION AND WEAR PROPERTIES AND METHODS OF MAKING

FIELD

The present disclosure relates to the field of coatings with improved properties. It more particularly relates to multilayer low friction coatings with improved abrasion and wear resistance, methods of making such coatings and methods of using such coatings to reduce friction and improve abrasion resistance.

BACKGROUND

Extended Reach Rotary Drilling Devices

In rotary drilling operations, a drill bit is attached to the end of a bottom hole assembly which is attached to a drill string comprising drill pipe and tool joints which may be rotated at the surface by a rotary table or top drive unit. The weight of the drill string and bottom hole assembly causes the rotating bit to bore a hole in the earth. As the operation progresses, new sections of drill pipe are added to the drill string to increase its overall length. Periodically during the drilling operation, the open borehole is cased to stabilize the walls, and the drilling operation is resumed. As a result, the drill string usually operates both in the open borehole and within the casing which has been installed in the borehole. Alternatively, coiled tubing may replace drill string in the drilling assembly. The combination of a drill string and bottom hole assembly or coiled tubing and bottom hole assembly is referred to herein as a drill stem assembly. Rotation of the drill string provides power through the drill string and bottom hole assembly to the bit. In coiled tubing drilling, power is delivered to the bit by the drilling fluid pumps. The amount of power which can be transmitted by rotation is limited to the maximum torque a drill string or coiled tubing can sustain.

During the drilling of a borehole through underground formations, the drill stem assembly undergoes considerable sliding contact with both the steel casing and rock formations. This sliding contact results primarily from the rotational and axial movements of the drill stem assembly in the borehole. Friction between the moving surface of the drill stem assembly and the stationary surfaces of the casing and formation creates considerable drag on the drill stem and results in excessive torque and drag during drilling operations. The problem caused by friction is inherent in any drilling operation, but it is especially troublesome in directionally drilled wells or extended reach drilling (ERD) wells. Directional drilling or ERD is the intentional deviation of a wellbore from the vertical. In some cases the angle from the vertical may be as great as ninety degrees from the vertical. Such wells are commonly referred to as horizontal wells and may be drilled to a considerable depth and considerable distance from the drilling platform.

In all drilling operations, the drill stem assembly has a tendency to rest against the side of the borehole or the well casing, but this tendency is much greater in directionally drilled wells because of the effect of gravity. As the drill string increases in length or degree of vertical deflection, the amount of friction created by the rotating drill stem assembly also increases. To overcome this increase in friction, additional power is required to rotate the drill stem assembly. In some cases, the friction between the drill stem assembly and the casing wall or borehole exceeds the maximum torque that can be tolerated by the drill stem assembly and/or maximum torque capacity of the drill rig and drilling operations must cease. Consequently, the depth to which wells can be drilled using available directional drilling equipment and techniques is limited.

Reduction of friction is a key requirement in such ultra-extended reach subterraneous oil and gas rotary drilling applications. One method for reducing the friction caused by the contact between the drill stem assembly and casing (in case of a cased hole) or borehole (in case of an open hole) is improving the lubricity of drilling muds. In industry drilling operations, attempts have been made to reduce friction through, mainly, using water and/or oil based mud solutions containing various types of expensive and often environmentally unfriendly additives. Diesel and other mineral oils are also often used as lubricants, but there is a problem with the disposal of the mud. Certain minerals such as bentonite are known to help reduce friction between the drill stem assembly and an open borehole. Materials such as Teflon have been used to reduce friction, however these lack durability and strength. Other additives to include vegetable oils, asphalt, graphite, detergents and walnut hulls, but each has its own limitations. While these muds have had some benefit, the disposal of mud is an issue. Additionally, a bigger issue is the fact that the COF increases with increasing temperature, especially with water-based muds.

Yet another method for reducing the friction between the drill stem assembly and the well casing or borehole is to use a hard facing material on the drill string assembly (also referred to herein as hardbanding or hardfacing). U.S. Pat. No. 4,665,996, herein incorporated by reference in its entirety, discloses the use of hardfacing the principal bearing surface of a drill pipe with an alloy having the composition of: 50-65% cobalt, 25-35% molybdenum, 1-18% chromium, 2-10% silicon and less than 0.1% carbon for reducing the friction between the drill string and the casing or rock. As a result, the torque needed for the rotary drilling operation, especially directional drilling, is decreased. The disclosed alloy also provides excellent wear resistance on the drill string while reducing the wear on the well casing. Hardbanding may be applied to portions of the drill stem assembly using weld overlay or thermal spray methods.

While the hardbanding has been effective in protecting tool joints to some extent, the carbide particles are known to cause severe abrasive wear of the casing material, thus limiting the effectiveness of this technique.

Another method for reducing the friction between the drill stem assembly and the well casing or borehole is to use aluminum drill string because aluminum is lighter than steel. However, the aluminum drill string is expensive and is difficult to use in drilling operations, and it is not compatible with many types of drilling fluids (e.g. drilling fluids with high pH).

U.S. Pat. Nos. 7,182,160, 6,349,779 and 6,056,073 disclose the designs of grooved segments in drill strings for the purpose of improving fluid flow in the annulus and reducing contact and friction with the borehole wall.

Still another problem encountered during subterraneous rotary drilling operations, especially directional drilling, is the wear on the casing and drill stem assembly that occurs when the metal surfaces contact each other. This abrasion between metal surfaces during the drilling of oil and gas wells results in excessive wear on both the drill stem assembly and the well casing. Presently, one preferred solution to reduce wear of drill stem assemblies is to hardface portions of the drill stem assembly. A tungsten carbide containing alloy, such as Stellite 6 and Stellite 12 (trademark of Cabot Corporation), has excellent wear resistance as a hardfacing material. Hardfacing protects the drill stem assembly, but it tends to cause excessive abrading of the well casing. This problem is especially severe during directional drilling because the drill stem assembly, which has a tendency to rest on the well casing, continually abrades the well casing as the drill string rotates. In addition, some of these hardfacing alloys, such as tungsten carbide, may make the friction problem worse.

Coated Sleeve Oil and Gas Well Production Devices:

In addition to the subterraneous rotary oil and gas drilling devices, friction is also an issue in oil and gas well production devices. Oil and gas well production suffers from basic mechanical problems that may be costly, or even prohibitive, to correct, repair, or mitigate. Friction is ubiquitous in the oilfield, devices that are in moving contact wear and lose their original dimensions, and devices are degraded by erosion, corrosion, and deposits. These are impediments to successful operations that may be mitigated by selective use of coated sleeved oil and gas well production devices as described below. These oil and gas well production devices include, but are not limited to, drilling rig equipment; marine riser systems; tubular goods; wellhead, trees, and valves; production equipment including artificial lift equipment, completion strings and equipment; formation and sandface completions; and well intervention equipment.

Petrochemical and Chemical Industry Equipment and Devices:

Components for equipment in petrochemical and chemical production suffer from degradation ranging from mechanical and chemical effects. For instance, components undergo wear due to repeated rubbing of surfaces resulting in failure requiring repair or replacement. Under certain circumstances, the debris produced by wear may also contaminate the product making it unacceptable. In addition to wear, excessive friction between surfaces could also enhance the energy required for the operation. Higher energy costs may also be realized while pumping fluids in the operation due to excessive friction or resistance between the fluid and the surface of the component that transmits it. Another example of degradation of components may relate to corrosion where the components need to be replaced periodically. Corrosion may also lead to fouling in the inner diameter of heat exchanger tubulars resulting in degradation of the heat transfer efficiency. These are all potential impediments to successful petrochemical operations that may be costly, or even prohibitive, to correct, repair, or mitigate.

Non-limiting exemplary applications of such coatings include extruders, barrels, gear boxes, bearings, compressors, pumps, pipes, tubing, molding dies, valves, and reactor vessels.

Need for the Current Disclosure:

Given the expansive nature of these broad requirements for extended reach rotary drilling devices, coated sleeve oil and gas well production devices and petrochemical and chemical industry equipment and devices, there is a need for low friction coatings with improved properties, such as friction, wear, abrasion, corrosion, erosion, and deposits. Given the operating environments for these applications, which typically include high loads and severe abrasive conditions, traditional and conventional low friction coatings (e.g., graphite, $MoS_2$, $WS_2$) may not meet durability requirements in some cases. Thus, there is a to need to develop low friction coatings that demonstrate adequate durability in these environments, through improved abrasion resistance and reduced wear on both the coated part as well as the counterface material (e.g. casing steel), relative to prior art coatings.

SUMMARY

According to one aspect of the present disclosure, an advantageous multi-layer low friction coating comprises: i) an under layer selected from the group consisting of CrN, TiN, TiAlN, TiAlVN, TiAlVCN, TiSiN, TiSiCN, TiAlSiN and combinations thereof, wherein the under layer ranges in thickness from 0.1 to 100 μm, ii) an adhesion promoting layer selected from the group consisting of Cr, Ti, Si, W, CrC, TiC, SiC, WC, and combinations thereof, wherein the adhesion promoting layer ranges in thickness from 0.1 to 50 μm and is contiguous with a surface of the under layer, and iii) a functional layer selected from the group consisting of a fullerene based composite, a diamond based material, diamond-like-carbon (DLC), and combinations thereof, wherein the functional layer ranges from 0.1 to 50 μm and is contiguous with a surface of the adhesion promoting layer. The adhesion promoting layer is interposed between the under layer and the functional layer, and may also provide the added function of toughness enhancement. The coefficient of friction of the functional layer of the low friction coating as measured by the block on ring friction test is less than or equal to 0.15, and the abrasion resistance of the low friction coating as measured by the modified ASTM G105 abrasion test yields a wear scar depth of less than or equal to 20 μm and a weight loss less than or equal to 0.03 grams.

According to another aspect of the present disclosure, a method of making a multi-layer low friction coating comprises: i) providing a substrate for coating, ii) depositing on a surface of the substrate an under layer selected from the group consisting of CrN, TiN, TiAlN, TiAlVN, TiAlVCN, TiSiN, TiSiCN, TiAlSiN and combinations thereof, wherein the under layer ranges in thickness to from 0.1 to 100 μm, iii) depositing on the surface of the under layer an adhesion promoting layer selected from the group consisting of Cr, Ti, Si, W, CrC, TiC, SiC, WC, and combinations thereof, wherein the adhesion promoting layer ranges in thickness from 0.1 to 50 μm and is contiguous with a surface of the under layer, and iv) depositing on the surface of the adhesion promoting layer a functional layer selected from the group consisting of a fullerene based composite, a diamond based material, diamond-like-carbon (DLC), and combinations thereof, wherein the functional layer ranges from 0.1 to 50 μm and is contiguous with a surface of the adhesion promoting layer. The coefficient of friction of the functional layer of the low friction coating as measured by the block on ring friction test is less than or equal to 0.15, and the abrasion resistance of the low friction coating as measured by the modified ASTM G105 abrasion test yields a wear scar depth of less than or equal to 20 μm and a weight loss less than or equal to 0.03 grams.

These and other features and attributes of the disclosed multilayer low friction coatings, methods of making such coatings and methods of using such coatings for subterraneous rotary drilling devices, coated sleeve oil and gas well production devices and petrochemical and chemical industry equipment and devices and their advantageous applications and/or uses will be apparent from the detailed description which follows, particularly when read in conjunction with the figures appended hereto.

BRIEF DESCRIPTION OF DRAWINGS

To assist those of ordinary skill in the relevant art in making and using the subject matter hereof, reference is made to the appended drawings, wherein:

FIG. 1 depicts X-sectional micrographs of test specimens deposited with different coating architectures after high-sand CETR-BOR testing wherein the bottom layer constitutes a (ferrous) substrate, an adhesion promoting (toughness enhancing) CrN layer separates the top functional layer(s) from the substrate. More detailed information on the architectures can be found in Table 1 below.

DEFINITIONS

"Bottom hole assembly" (BHA) is comprised of one or more devices, including but not limited to: stabilizers, variable-gauge stabilizers, back reamers, is drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, acceleration jars, crossover subs, bumper jars, torque reduction tools, float subs, fishing tools, fishing jars, washover pipe, logging tools, survey tool subs, non-magnetic counterparts of any of these devices, and combinations thereof and their associated external connections.

"Casing" is pipe installed in a wellbore to prevent the hole from collapsing and to enable drilling to continue below the bottom of the casing string with higher fluid density and without fluid flow into the cased formation. Typically, multiple casing strings are installed in the wellbore of progressively smaller diameter.

"Casing centralizers" are sleeves banded to the outside of casing as it is being run in hole. Centralizers are often equipped with steel springs or metal fingers that push against the formation to achieve standoff from the formation wall, with an objective to centralize the casing to provide a more uniform annular space around the casing to achieve a better cement seal. Centralizers may include finger-like devices to scrape the wellbore to dislodge drilling fluid filtercake that may inhibit direct cement contact with the formation.

"Contiguous" refers to objects which are adjacent to one another such that they may share a common edge or face. "Non-contiguous" refers to objects that do not have a common edge or face because they are offset or displaced from one another. For example, tool joints are larger diameter cylinders that are non-contiguous because a smaller diameter cylinder, the drill pipe, is positioned between the tool joints.

"Coupling" is a connecting device between two pieces of pipe, often but not exclusively a separate piece that is threadably adapted to two longer pieces that the coupling joins together. For example, a coupling is used to join two pieces of sucker rods in artificial lift rod pumping equipment.

"Drill collars" are heavy wall pipe in the bottom hole assembly near the bit. The stiffness of the drill collars help the bit to drill straight, and the weight of the collars are used to apply weight to the bit to drill forward.

"Drill stem" is defined as the entire length of tubular pipes, comprised of the kelly (if present), the drill pipe, and drill collars, that make up the drilling assembly from the surface to the bottom of the hole. The drill stem does not include the drill bit. In the special case of casing-while-drilling operations, the casing string that is used to drill into the earth formations will be considered part of the drill stem.

"Drill stem assembly" is defined as a combination of a drill string and bottom hole assembly or coiled tubing and bottom hole assembly. The drill stem assembly does not include the drill bit.

"Drill string" is defined as the column, or string of drill pipe with attached tool joints, transition pipe between the drill string and bottom hole assembly including tool joints, heavy weight drill pipe including tool joints and wear pads that transmits fluid and rotational power from the top drive or kelly to the drill collars and the bit. In some references, but not in this document, the term "drill string" includes both the drill pipe and the drill collars in the bottomhole assembly.

"Elbows, tees, and couplings" are commonly used pipe equipment for the purpose of connecting flowlines to complete a flowpath for fluids, for example to connect a wellbore to surface production facilities.

"Kelly" is a flat-sided polygonal piece of pipe that passes through the drilling rig floor on rigs equipped with older rotary table equipment. Torque is applied to this four-, six-, or perhaps eight-sided piece of pipe to rotate the drill pipe that is connected below.

"Logging tools" are instruments that are typically run in a well to make measurements; for example, during drilling on the drill stem or in open or cased hole on wireline. The instruments are installed in a series of carriers configured to run into a well, such as cylindrical-shaped devices, that provide environmental isolation for the instruments.

"Plunger lift" is a device that moves up and down a tubing string to purge the tubing of water, similar to a pipeline "pigging" operation. With the plunger lift at the bottom of the tubing, the pig device is configured to block fluid flow, and therefore it is pushed uphole by fluid pressure from below. As it moves up the wellbore it displaces water because the water is not allowed to separate and flow past the plunger lift. At the top of the tubing, a device triggers a change in the plunger lift configuration such that it now bypasses fluids, whereupon gravity pulls it down the tubing against the upwards flowstream. Friction and wear are important parameters in plunger lift operation. Friction reduces the speed of the plunger lift falling or rising, and wear of the outer surface provides a gap that reduces the effectiveness of the device when traveling uphole.

"Production device" is a broad term defined to include any device related to the drilling, completion, stimulation, workover, or production of an oil and/or gas well. A production device includes any device described herein used for the purpose of oil or gas production. For convenience of terminology, injection of fluids into a well is defined to be production at a negative rate. Therefore, references to the word "production" will include "injection" unless stated otherwise.

"Shock sub" is a modified drill collar that has a shock absorbing spring-like element to provide relative axial motion between the two ends of the shock sub. A shock sub is sometimes used for drilling very hard formations in which high levels of axial shocks may occur.

"Sleeve" is a tubular part designed to fit over another part. The inner and outer surfaces of the sleeve may be circular or non-circular in cross-section profile. The inner and outer surfaces may generally have different geometries, i.e. the outer surface may be cylindrical with circular cross-section, whereas the inner surface may have an elliptical or other non-circular cross-section. Alternatively, the outer surface may be elliptical and the inner surface circular, or some other combination. The use of pins, slots, and other means may be used to constrain the sleeve to a body in one or more degrees of freedom, and seal elements may be used if there are fluid differential pressure or containment issues. More generally, a sleeve may be considered to be a generalized hollow cylinder with one or more radii or varying cross-sectional profiles along the axial length of the cylinder.

"Sliding contact" refers to frictional contact between two bodies in relative motion, whether separated by fluids or solids, the latter including particles in fluid (bentonite, glass beads, etc) or devices designed to cause rolling to mitigate friction. A portion of the contact surface of two bodies in relative motion to will always be in a state of slip, and thus sliding.

"Sucker rods" are steel rods that connect a beam-pumping unit at the surface with a sucker-rod pump at the bottom of a well. These rods may be jointed and threaded or they may be continuous rods that are handled like coiled tubing. As the rods reciprocate up and down, there is friction and wear at the is locations of contact between the rod and tubing.

"Tool joint" is a tapered threaded coupling element for pipe that is usually made of a special steel alloy wherein the pin and box connections (externally and internally threaded, respectively) are fixed to either ends of the pipe. Tool joints are commonly used on drill pipe but may also be used on work strings and other OCTG, and they may be friction welded to the ends of the pipe.

"Top drive" is a method and equipment used to rotate the drill pipe from a drive system located on a trolley that moves up and down rails attached to the drilling rig mast. Top drive is the preferred means of operating drill pipe because it facilitates simultaneous rotation and reciprocation of pipe and circulation of drilling fluid. In directional drilling operations, there is often less risk of sticking the pipe when using top drive equipment.

"Tubing" is pipe installed in a well inside casing to allow fluid flow to the surface.

"Valve" is a device that is used to control the rate of flow in a flowline. There are many types of valve devices, including check valve, gate valve, globe valve, ball valve, needle valve, and plug valve. Valves may be operated manually, remotely, or automatically, or a combination thereof. Valve performance is highly dependent on the seal established between close-fitting mechanical devices.

"Valve seat" is the static surface upon which the dynamic seal rests when the valve is operated to prevent flow through the valve. For example, a flapper of a subsurface safety valve will seal against the valve seat when it is closed.

"Wireline" is a cable that is used to run tools and devices in a wellbore. Wireline is often comprised of many smaller strands twisted together, but monofilament wireline, or "slick line," also exists. Wireline is usually deployed on large drums mounted on logging trucks or skid units.

"Work strings" are jointed pieces of pipe used to perform a wellbore operation, such as running a logging tool, fishing materials out of the wellbore, or performing a cement squeeze job.

A "coating" is comprised of one or more adjacent layers and any included interfaces. A coating may be placed on the base substrate material of a body assembly, on the hardbanding placed on a base substrate material, or on another coating.

A "low friction coating" is a coating for which the coefficient of friction is less than 0.15 under reference conditions. A typical low friction coating can include one or more underlayer(s), adhesion promoting layer(s) and functional layer(s)

A "layer" is a thickness of a material that may serve a specific functional purpose such as reduced coefficient of friction, high stiffness, or mechanical support for overlying layers or protection of underlying layers.

A "low friction layer" or "functional layer" is a layer that provides low friction in a low friction coating. It can also provide for improved abrasion and wear resistance.

An "adhesion promoting layer" provides enhanced adhesion between to functional layer(s) and/or underlayer(s) in a multi-layer coating. It can also provide enhanced toughness.

An "underlayer" is applied between the outer surface of body assembly substrate material or hardbanding or buttering layer and adhesion promoting layer or functional layer or between functional layer(s) and/or adhesion promoting layer(s) in a multi-layer coating.

A "graded layer" is a layer in which at least one constituent, element, component, or intrinsic property of the layer changes over the thickness of the layer or some fraction thereof.

A "buttering layer" is a layer interposed between the outer surface of the body assembly substrate material or hardbanding and a layer, which may be another buttering layer, or a layer comprising the low friction coating. There may be one or more buttering layers interposed in such a manner. The buttering layer can include, but is not limited to, underlayer(s) that comprise the low friction coating.

"Hardbanding" is a layer interposed between the outer surface of the body assembly substrate material and the buttering layer(s), or one of the layers comprising the low friction coating. Hardbanding may be utilized in the oil and gas drilling industry to prevent tool joint and casing wear.

An "interface" is a transition region from one layer to an adjacent layer wherein one or more constituent material composition and/or property value changes from 5% to 95% of the values that characterize each of the adjacent layers.

A "graded interface" is an interface that is designed to have a gradual change of constituent material composition and/or property value from one layer to the adjacent layer. For example, a graded interface may be created as a result of gradually stopping the processing of a first layer while simultaneously gradually commencing the processing of a second layer.

A "non-graded interface" is an interface that has a sudden change of constituent material composition and/or property value from one layer to the adjacent layer. For example, a non-graded interface may be created as a result of stopping the processing of one layer and subsequently commencing the processing of a second layer.

(Note: Several of the above definitions are from *A Dictionary for the Petroleum Industry*, Third Edition, The University of Texas at Austin. Petroleum Extension Service, 2001.)

DETAILED DESCRIPTION

All numerical values within the detailed description and the claims herein are modified by "about" or "approximately" the indicated value, and take into account experimental error and variations that would be expected by a person having ordinary skill in the art.

RELATED APPLICATIONS

U.S. Pat. No. 8,220,563, herein incorporated by reference in its entirety, discloses the use of ultra-low friction coatings on drill stem assemblies used in gas and oil drilling applications. Other oil and gas well production devices may benefit from the use of the coatings disclosed herein. A drill stem assembly is one example of a production device that may benefit from the use of coatings. The geometry of an operating drill stem assembly is one example of a class of applications comprising a cylindrical body. In the case of the drill stem, the actual drill stem assembly is an inner cylinder that is in sliding contact with the casing or open hole, an outer cylinder. These devices may have varying radii and alternatively may be described as comprising multiple contiguous cylinders of varying radii. As described below, there are several other instances of cylindrical bodies in oil and gas well production operations, either in sliding contact due to relative motion or stationary subject to contact by fluid flowstreams. The inventive coatings may be used advantageously for each of these applications by considering the relevant problem to be addressed, by evaluating the contact or flow problem to be solved to mitigate friction, wear, corrosion, erosion, or deposits, and by judicious consideration of how to apply such coatings to the specific devices for maximum utility and benefit.

U.S. Pat. No. 8,261,841, herein incorporated by reference in its entirety, discloses the use of ultra-low friction coatings on oil and gas well production devices and methods of making and using such coated devices. In one form, the coated oil and gas well production device includes an oil and gas well production device including one or more bodies, and a coating on at least a portion of the one or more bodies, wherein the coating is chosen from an amorphous alloy, a heat-treated electroless or electro plated based nickel-phosphorous composite with a phosphorous content greater than 12 wt %, graphite, $MoS_2$, $WS_2$, a fullerene based composite, a boride based cermet, a quasicrystalline material, a diamond based material, diamond-like-carbon (DLC), boron nitride, and combinations thereof. The coated oil and gas well production devices may provide for reduced friction, wear, corrosion, erosion, and deposits for well construction, completion and production of oil and gas.

U.S. Pat. No. 8,286,715, herein incorporated by reference in its entirety, discloses the use of ultra-low friction coatings on sleeved oil and gas well production devices and methods of making and using such coated devices. In one to form, the coated sleeved oil and gas well production device includes an oil and gas well production device including one or more bodies and one or more sleeves proximal to the outer or inner surface of the one or more bodies, and a coating on at least a portion of the inner sleeve surface, outer sleeve surface, or a combination thereof, wherein the coating is chosen from an amorphous alloy, a heat-treated electroless or electro plated based nickel-phosphorous composite with a phosphorous content greater than 12 wt %, graphite, MoS2, WS2, a fullerene based composite, a boride based cermet, a quasicrystalline material, a diamond based material, diamond-like-carbon (DLC), boron nitride, and combinations thereof. The coated sleeved oil and gas well production devices may provide for reduced friction, wear, erosion, corrosion, and deposits for well construction, completion and production of oil and gas.

U.S. Patent Publication No. 2011-0220415A1, herein incorporated by reference in its entirety, discloses drill stem assemblies with ultra-low friction coatings for subterraneous drilling operations. In one form, the coated drill stem assemblies for subterraneous rotary drilling operations include a body assembly with an exposed outer surface including a drill string coupled to a bottom hole assembly, a coiled tubing coupled to a bottom hole assembly, or a casing string coupled to a bottom hole assembly and an ultra-low friction coating on at least a portion of the exposed outer surface of the body assembly, hardbanding on at least a portion of the exposed outer surface of the body assembly, an ultra-low friction coating on at least a portion of the hardbanding, wherein the ultra-low friction coating comprises one or more ultra-low friction layers, and one or more buttering layers interposed between the hardbanding and the ultra-low friction coating. The coated drill stem assemblies provide for reduced friction, vibration (stick-slip and torsional), abrasion, and wear during straight hole or directional drilling to allow for improved rates of penetration and enable ultra-extended reach drilling with existing top drives.

U.S. Patent Publication No. 2011-0220348A1, herein incorporated by reference in its entirety, discloses coated oil and gas well production devices and methods of making and using such coated devices. In one form, the coated device includes one or more cylindrical bodies, hardbanding on at least a portion of the exposed outer surface, exposed inner surface, or a combination of both exposed outer or inner surface of the one or more cylindrical bodies, and a coating on at least a portion of the inner surface, the outer surface, or a combination thereof of the one or more cylindrical bodies. The coating includes one or more ultra-low friction layers, and one or more buttering layers interposed between the hardbanding and the ultra-low friction coating. The coated oil and gas well production devices may provide for reduced friction, wear, erosion, corrosion, and deposits for well construction, completion and production of oil and gas.

U.S. Patent Publication No. 2011-0203791A1, herein incorporated by reference in its entirety, discloses coated sleeved oil and gas well production devices and methods of making and using such coated sleeved devices. In one form, the coated sleeved oil and gas well production device includes one or more cylindrical bodies, one or more sleeves proximal to the outer diameter or inner diameter of the one or more cylindrical bodies, hardbanding on at least a portion of the exposed outer surface, exposed inner surface, or a combination of both exposed outer or inner surface of the one or more sleeves, and a coating on at least a portion of the inner sleeve surface, the outer sleeve surface, or a combination thereof of the one or more sleeves. The coating includes one or more ultra-low friction layers, and one or more buttering layers interposed between the hardbanding and the ultra-low friction coating. The coated sleeved oil and gas well production devices may provide for reduced friction, wear, erosion, corrosion, and deposits for well construction, completion and production of oil and gas.

U.S. Patent Publication No. 2011-0162751A1, herein incorporated by to reference in its entirety, discloses coated petrochemical and chemical industry devices and methods of making and using such coated devices. In one form, the coated petrochemical and chemical industry device includes a petrochemical and chemical industry device including one or more bodies, and a coating on at least a portion of the one or more bodies, wherein the coating is chosen from an amorphous alloy, a heat-treated electroless or electro plated based nickel-phosphorous composite with a phosphorous content greater than 12 wt %, graphite, $MoS_2$, $WS_2$, a fullerene based composite, a boride based cermet, a quasi-crystalline material, a diamond based material, diamond-like-carbon (DLC), boron nitride, and combinations thereof. The coated petrochemical and chemical industry devices may provide for reduced friction, wear, corrosion and other properties required for superior performance.

U.S. Provisional Patent Application No. 61/542,501 filed on Oct. 3, 2012, herein incorporated by reference in its entirety, discloses methods and systems for vacuum coating the outside surface of tubular devices for use in oil and gas exploration, drilling, completions, and production operations for friction reduction, erosion reduction and corrosion protection. These methods include embodiments for sealing tubular devices within a vacuum chamber such that the entire device is not contained within the chamber. These methods also include embodiments for surface treating of tubular devices prior to coating. In addition, these methods include embodiments for vacuum coating of tubular devices using a multitude of devices, a multitude of vacuum chambers and various coating source configurations.

Exemplary Multi-layer Low Friction Coating Embodiments:

The Applicants have discovered multi-layer low friction coatings that yield improved coating durability in severe abrasive/loading conditions. In a preferred form, these low friction coatings include a diamond-like-carbon (DLC) as one of the layers in the coating.

DLC coatings offer an attractive option to mitigate the negative effects discussed above, as (a) very low COF values can be realized (<0.15, and even <0.1), (b) the COF remains largely stable as a function of temperature, and (c) abrasive wear issues caused by hard particles such as carbides are greatly reduced. The typical structure of DLC coatings requires a layer of very hard amorphous carbon in varying forms of hybridization (i.e. sp2 or sp3-like character). Typically, with increasing sp3 content, the DLC layer becomes harder, but may also develop more residual compressive stress. The hardness and residual stress can be controlled by varying the sp2/sp3 ratio. Increasing sp2 content (i.e. graphite-like nature) typically reduces the hardness and the compressive strength. The sp2/sp3 ratio and overall chemistry can be varied by controlling various parameters during the deposition process (e.g. PVD, CVD or PACVD), such as substrate bias, gas mixture ratio, laser fluence (if applicable), substrate, deposition temperature, hydrogenation level, use of dopants in the DLC layer (metallic and/or non-metallic) etc. However, the reduction of residual stress in the DLC layer is generally accompanied by a reduction in hardness of the DLC (and reduction in sp3 content). While highly sp3-like DLC coatings can reach very high hardness values (~4500-6000 Hv), these coatings exhibit compressive stresses >>1 GPa, detrimental to durability in applications describe above.

Hence, there is a need for novel DLC compositions with varying sp2/sp3 ratios, aimed at providing higher hardness values (in the range of 1700-5500 Hv) for use in extended reach rotary drilling devices, coated oil and gas well production devices (sleeved and unsleeved) and petrochemical and chemical industry equipment and devices. Hardness values lower than ~1500 Hv are considered unsuitable for the envisioned application space, as the abrasive nature of relatively hard particles (e.g. sand, components of oil-based drilling mud etc.) is expected to quickly wear out the DLC coating.

While typical DLC coatings do offer improved hardness (in the range of to 2500 Hv), there is a need to consider harder versions (Hv>3000) while managing residual stress for optimal coating thickness buildup. In addition, there is a need to minimize the plastic deformation of underlying substrate in the presence of abrasive, 3-body contact scenarios.

Durability of Diamond-like Carbon (DLC) coatings under three-body contact scenarios (i.e., in the presence of abrasive particles) is limited by overall abrasion resistance of the coating and spallation/delamination of coating that can be instigated by plastic deformation of underneath substrate due to creation of high local stresses. For DLC coatings to have enhanced durability in severe loading/abrasive environments, techniques to suppress existing failure modes to improve overall durability are needed.

In one form, a multi-layer low friction coating of the present disclosure includes an under layer that would be contiguous with a surface of a substrate for coating, an adhesion promoting and toughness enhancing layer contiguous with a surface of the under layer, and a functional layer contiguous with a surface of the adhesion promoting layer. Hence, the adhesion promoting layer is interposed between the under layer and the functional layer. The functional layer is the outermost exposed layer of the multi-layer low friction coating.

The surface of the substrate for coating may be made from a variety of different materials. Non-limiting exemplary substrates for coating include steel, stainless steel, hardbanding, an iron alloy, an aluminum based alloy, a titanium based alloy, ceramics and a nickel based alloy. Non-limiting exemplary hardbanding materials include cermet based materials, metal matrix composites, nanocrystalline metallic alloys, amorphous alloys and hard metallic alloys. Other non-limiting exemplary types of hardbanding include carbides, nitrides, borides, and oxides of elemental tungsten, titanium, niobium, molybdenum, iron, chromium, and silicon dispersed within a metallic alloy matrix. Such hardbanding may be deposited by weld overlay, thermal spraying or laser/electron beam cladding. The thickness of hardbanding layer may range from several orders of magnitude times that of or equal to the thickness of the outer coating layer. Non-limiting exemplary hardbanding thicknesses are 1 mm, 2 mm, and 3 mm proud above the surface of the drill stem assembly. The hardbanding surface may have a patterned design to reduce entrainment of abrasive particles that contribute to wear. The multi-layer low friction coatings disclosed herein may be deposited on top of the hardbanding pattern. The hardbanding pattern may include both recessed and raised regions and the thickness variation in the hardbanding can be as much as its total thickness.

The multi-layer low friction coatings of the present disclosure may be applied to a portion of the surface of a device chosen from the following exemplary non-limiting types: a drill bit for subterraneous rotary drilling, a drill stem assembly for subterraneous rotary drilling, a casing, a tubing, couplings, a work string, a coiled tubing, a pipe, a riser, a plunger, centralizers, a completion string, a production string, and a petrochemical and chemical production device. In addition, the multi-layer low friction coatings of the present disclosure may be applied to a portion of the surface of devices described in the definition section of the present disclosure.

The under layer of the low friction coating disclosed herein may be made from a variety of different materials, including, but not limited to, CrN, TiN, TiAlN, TiAlVN, TiAlVCN, TiSiN, TiSiCN, TiAlSiN and combinations thereof.

The thickness of the under layer may range from 0.1 to 100 µm, or 1 to 75 µm, or 2 to 50 µm, or 3 to 35 µm, or 5 to 25 µm. The under layer may have a hardness that ranges from 800 to 4000 VHN, or 1000 to 3500 VHN, or 1200 to 3000 VHN, or 1500 to 2500 VHN, or 1800 to 2200 VHN.

The adhesion promoting layer of the low friction coating disclosed herein not only improves the adhesion between the under layer and the functional to layer, but also enhances the overall toughness of the coating. For this reason, it may also be referred to herein as a toughness enhancing layer. The adhesion promoting layer of the low friction coating disclosed herein may be made from a variety of different materials, including, but not limited to, Cr, Ti, Si, W, CrC, TiC, SiC, WC, and combinations thereof. The thickness of the adhesion promoting layer may range from 0 to 60 µm, or 0.01 to 50 µm, or 0.1 to 25 µm, or 0.2 to 20 µm, or 0.3 to 15 µm, or 0.5 to 10 µm. The adhesion promoting layer may have a hardness that ranges from 200 to 2500 VHN, or 500 to 2000 VHN, or 800 to 1700 VHN, or 1000 to 1500 VHN. There is also generally a compositional gradient or transition at the interface of the under layer and the adhesion promoting layer, which may range in thickness from 0.01 to 10 µm, or 0.05 to 9 µm, or 0.1 to 8 µm, or 0.5 to 5 µm.

The functional layer of the low friction coating disclosed herein may be made from a variety of different materials, including, but not limited to, a fullerene based composite, a diamond based material, diamond-like-carbon (DLC) and combinations thereof. Non-limiting exemplary diamond based materials include chemical vapor deposited (CVD) diamond or polycrystalline diamond compact (PDC). The functional layer of the low friction coating disclosed herein is advantageously diamond-like-carbon (DLC) coating, and more particularly the DLC coating may be chosen from tetrahedral amorphous carbon (ta-C), tetrahedral amorphous hydrogenated carbon (ta-C:H), diamond-like hydrogenated carbon (DLCH), polymer-like hydrogenated carbon (PLCH), graphite-like hydrogenated carbon (GLCH), silicon containing diamond-like-carbon (Si-DLC), titanium containing diamond-like-carbon (Ti-DLC), chromium containing diamond-like-carbon (Cr-DLC), metal containing diamond-like-carbon (Me-DLC), oxygen containing diamond-like-carbon (O-DLC), nitrogen containing diamond-like-carbon (N-DLC), boron containing diamond-like-carbon (B-DLC), fluorinated diamond-like-carbon (F-DLC), sulfur-containing diamond-like carbon (S-DLC), and combinations thereof. The functional layer may be graded for improved durability, friction reduction, adhesion, and mechanical performance. The thickness of the functional layer may range from 0.1 to 50 µm, or 0.2 to 40 µm, or 0.5 to 25 µm, or 1 to 20 µm, or 2 to 15 µm, or 5 to 10 µm. The functional layer may have a Vickers hardness that ranges from 1000 to 7500 VHN, or 1500 to 7000 VHN, or 2000 to 6500 VHN, or 2200 to 6000 VHN, or 2500 to 5500 VHN, or 3000 to 5000 VHN. The functional layer may have a surface roughness that ranges from 0.01 µm to 1.0 µm Ra, or 0.03 µm to 0.8 µm Ra, or 0.05 µm to 0.5 µm Ra, or 0.07 µm to 0.3 µm Ra, or 0.1 µm to 0.2 µm Ra. There is also generally a compositional gradient or transition at the interface of the adhesion promoting layer and the functional layer, which may range in thickness from 0.01 to 10 µm, or 0.05 to 9 µm, or 0.1 to 8 µm, or 0.5 to 5 µm.

In another form of the present disclosure, the multi-layer low friction coating including an under layer contiguous with a surface of a substrate for coating, an adhesion promoting layer contiguous with a surface of the under layer, and a functional layer contiguous with a surface of the adhesion promoting layer may further include a second adhesion promoting layer that is contiguous with a surface of the functional layer, and a second functional layer that is contiguous with a surface of the second adhesion promoting layer. Hence, the second adhesion promoting layer is interposed between the functional layer described above and a second functional layer. The second functional layer is the outermost exposed layer of the multi-layer low friction coating.

The second adhesion promoting layer may be made from the following non-limiting exemplary materials: Cr, Ti, Si, W, CrC, TiC, SiC, WC, and combinations thereof. The thickness of the second adhesion promoting layer may range from 0 to 60 µm, or 0.1 to 50 µm, or 1 to 25 µm, or 2 to 20 µm, or 3 to 15 µm, or 5 to 10 µm. The second adhesion promoting layer may have a Vickers hardness that ranges from 200 to 2500 VHN, or 500 to 2000 VHN, or 800 to 1700 VHN, or 1000 to 1500 VHN. There is also generally a compositional gradient or transition at the interface of the functional layer and the second adhesion promoting layer, which may range in thickness from 0.01 to 10 µm, or 0.05 to 9 µm, or 0.1 to 8 µm, or 0.5 to 5 µm.

The second functional layer may also be made from a variety of different materials, including, but not limited to, a fullerene based composite, a diamond based material, diamond-like-carbon (DLC) and combinations thereof. Non-limiting exemplary diamond based materials include chemical vapor deposited (CVD) diamond or polycrystalline diamond compact (PDC). Non-limiting exemplary diamond-like-carbon include ta-C, ta-C:H, DLCH, PLCH, GLCH, Si-DLC, N-DLC, O-DLC, B-DLC, Me-DLC, F-DLC and combinations thereof. The thickness of the second functional layer may range from 0.1 to 50 µm, or 0.2 to 40 µm, or 0.5 to 25 µm, or 1 to 20 µm, or 2 to 15 µm, or 5 to 10 µm. The second functional layer may have a hardness that ranges from 1000 to 7500 VHN, or 1500 to 7000 VHN, or 2000 to 6500 VHN, or 2500 to 6000 VHN, or 3000 to 5500 VHN, or 3500 to 5000 VHN. The second functional layer may have a surface roughness that ranges from 0.01 µm to 1.0 µm Ra, or 0.03 µm to 0.8 µm Ra, or 0.05 µm to 0.5 µm Ra, or 0.07 µm to 0.3 µm Ra, or 0.1 µm to 0.2 µm Ra. There is also generally a compositional gradient or transition at the interface of the second adhesion promoting layer and the second functional layer, which may range in thickness from 0.01 to 10 µm, or 0.05 to 9 µm, or 0.1 to 8 µm, or 0.5 to 5.

The multi-layer low friction coating including a second adhesion promoting layer and a second functional layer may also optionally include a second under layer interposed between the functional layer and the second adhesion promoting layer. The second under layer of the low friction coating disclosed herein may be made from a variety of different materials, including, but not limited to, CrN, TiN, TiAlN, TiAlVN, TiAlVCN, TiSiN, TiSiCN, TiAlSiN and combinations thereof. The thickness of the second under layer may range to from 0.1 to 100 µm, or 2 to 75 µm, or 2 to 75 µm, or 3 to 50 µm, or 5 to 35 µm, or to 25 µm. The second under layer may have a hardness that ranges from 800 to 3500 VHN, or 1000 to 3300 VHN, or 1200 to 3000 VHN, or 1500 to 2500 VHN, or 1800 to 2200 VHN.

In yet another form of the present disclosure, the multi-layer low friction coating including an under layer contiguous with a surface of a substrate for coating, an adhesion promoting layer contiguous with a surface of the under layer, and a functional layer contiguous with a surface of the adhesion promoting layer may further include from 1 to 100 series of incremental coating layers, wherein each series of incremental coating layers includes a combination of an incremental adhesion promoting layer, an incremental functional layer and an optional incremental under layer, wherein the each series of incremental coating layers is configured as follows: A) the optional incremental under layer contiguous with a surface of the functional layer and the incremental adhesion promoting layer; wherein the optional incremental under layer is interposed between the functional layer and the incremental adhesion promoting layer; B) the incremental adhesion promoting layer contiguous with a surface of the functional layer or optional incremental under layer, and the incremental functional layer; and the incremental adhesion promoting layer is interposed between the functional layer and the incremental functional layer or between the optional incremental under layer and the incremental functional layer; and C) the incremental functional layer is contiguous with a surface of the incremental adhesion promoting layer.

The optional incremental under layer of the low friction coating disclosed herein may be made from a variety of different materials, including, but not limited to, CrN, TiN, TiAlN, TiAlVN, TiAlVCN, TiSiN, TiSiCN, TiAlSiN and combinations thereof. The thickness of the optional incremental under layer may range from 0.1 to 100 µm, or 2 to 75 µm, or 2 to 75 µm, or 3 to 50 µm, or 5 to 35 µm, or 10 to 25 µm. The optional incremental under layer may have a hardness that ranges from 800 to 3500 VHN, or 1000 to 3300 VHN, or 1200 to 3000 VHN, or 1500 to 2500 VHN, or 1800 to 2200 VHN.

The incremental adhesion promoting layer may be made from the following non-limiting exemplary materials: Cr, Ti, Si, W, CrC, TiC, SiC, WC, and combinations thereof. The thickness of the incremental adhesion promoting layer may range from 0 to 60 µm, or 0.1 to 50 µm, or 1 to 25 µm, or 2 to 20 µm, or 3 to 15 µm, or 5 to 10 µm. The incremental adhesion promoting layer may have a hardness that ranges from 200 to 2500 VHN, or 500 to 2000 VHN, or 800 to 1700 VHN, or 1000 to 1500 VHN. There is also generally a compositional gradient or transition at the interface of the optional incremental under layer and the incremental adhesion promoting layer, which may range in thickness from 0.01 to 10 µm, or 0.05 to 9 µm, or 0.1 to 8 µm, or 0.5 to 5 µm.

The incremental functional layer may be made from a variety of different materials, including, but not limited to, a fullerene based composite, a diamond based material, diamond-like-carbon (DLC) and combinations thereof. Non-limiting exemplary diamond based materials include chemical vapor deposited (CVD) diamond or polycrystalline diamond compact (PDC). Non-limiting exemplary diamond-like-carbon include ta-C, ta-C:H, DLCH, PLCH, GLCH, Si-DLC, N-DLC, O-DLC, B-DLC, Me-DLC, F-DLC and combinations thereof. The thickness of the incremental functional layer may range from 0.1 to 50 µm, or 0.2 to 40 µm, or 0.5 to 25 µm, or 1 to 20 µm, or 2 to 15 µm, or 5 to 10 µm. The incremental functional layer may have a hardness that ranges from 1000 to 7500 VHN, or 1500 to 7000 VHN, or 2000 to 6500 VHN, or 2200 to 6000 VHN, or 2500 to 5500 VHN, or 3000 to 5000 VHN. The incremental functional layer may have a surface roughness that ranges from 0.01 µm to 1.0 µm Ra, or 0.03 µm to 0.8 µm Ra, or 0.05 µm to 0.5 µm Ra, or 0.07 µm to 0.3 µm Ra, or 0.1 µm to 0.2 µm Ra. There is also generally a compositional gradient or transition at to the interface of the incremental adhesion promoting layer and the incremental functional layer, which may range in thickness from 0.01 to 10 µm, or 0.05 to 9 µm, or 0.1 to 8 µm, or 0.5 to 5 µm.

The total thickness of the multi-layered low friction coatings of the present disclosure may range from 0.5 to 5000 microns. The lower limit of the total multi-layered coating thickness may be 0.5, 0.7, 1.0, 3.0, 5.0, 7.0, 10.0, 15.0, or 20.0 microns in thickness. The upper limit of the total multi-layered coating thickness may be 25, 50, 75, 100, 200, 500, 1000, 3000, 5000 microns in thickness.

The multi-layer low friction coatings of the present disclosure yield a coefficient of friction of the functional layer of the low friction coating as measured by the block on ring friction test is less than or equal to 0.15, or less than or equal to 0.12, or less than or equal to 0.10, or less than or equal to 0.08. The friction force may be calculated as follows: Friction Force=Normal Force×Coefficient of Friction. The multi-layer low friction coating of the present disclosure yields a counterface wear scar depth as measured by the block on ring friction test of less than or equal to 500 µm, or less than or equal to 300 µm, or less than or equal to 100 µm, or less than or equal to 50 µm.

The multi-layer low friction coatings of the present disclosure also yield an unexpected improvement in abrasion resistance. The modified ASTM G105 abrasion test may be used to measure the abrasion resistance. In particular, the multi-layer low friction coatings of the present disclosure yield an abrasion resistance as measured by the modified ASTM G105 abrasion test for wear scar depth and weight loss that is at least 5 times lower, or at least 4 times lower, or at least 2 times lower than a single layer coating of the same functional layer. The multi-layer low friction coatings of the present disclosure yield a wear scar depth via the modified ASTM G105 abrasion test of less than or equal to 20 µm, or less than or equal to 15 µm, or less than or equal to 10 µm, or less than or equal to 5 µm, or less than or equal to 2 µm. The multi-layer low friction coatings of the present disclosure yield a weight loss via the modified ASTM G105 abrasion test of less than or equal to 0.03 grams, or less than or equal to 0.02 grams, or less than or equal to 0.01 grams, or less than or equal to 0.005 grams, or less than or equal to 0.004 grams, or less than or equal to 0.001 grams.

Exemplary Method of Making Multi-layer Low Friction Coatings Embodiments:

The multi-layer low friction coatings of the present disclosure may be made by a variety of process techniques. In one exemplary form, a method of making a low friction coating includes the following steps: i) providing a substrate for coating, ii) depositing on a surface of the substrate an under layer, iii) depositing on the surface of the under layer an adhesion promoting layer is contiguous with a surface of the under layer, iv) depositing on the surface of the adhesion promoting layer a functional layer that is contiguous with a surface of the adhesion promoting layer.

The under layer of the method of making a low friction coating disclosed herein may be made from a variety of different materials, including, but not limited to, CrN, TiN, TiAlN, TiAlVN, TiAlVCN, TiSiN, TiSiCN, TiAlSiN and combinations thereof. The thickness of the under layer may range from 0.1 to 100 µm, or 2 to 75 µm, or 2 to 75 µm, or 3 to 50 µm, or 5 to 35 µm, or 10 to 25 µm. The under layer may have a hardness that ranges from 800 to 3500 VHN, or 1000 to 3300 VHN, or 1200 to 3000 VHN, or 1500 to 2500 VHN, or 1800 to 2200 VHN.

The adhesion promoting layer of the method of making a low friction coating disclosed herein not only improves the adhesion between the under layer and the functional layer, but also improves the toughness of the coating. For this reason, it may also be referred to herein as a toughness enhancing layer. The adhesion promoting layer of the low friction coating disclosed herein may be to made from a variety of different materials, including, but not limited to, Cr, Ti, Si, W, CrC, TiC, SiC, WC, and combinations thereof. The thickness of the adhesion promoting layer may range from 0 to 60 µm, or 0.1 to 50 µm, or 1 to 25 µm, or 2 to 20 µm, or 3 to 15 µm, or 5 to 10 µm. The adhesion promoting layer may have a hardness that ranges from 200 to 2500 VHN, or 500 to 2000 VHN, or 800 to 1700 VHN, or 1000 to 1500 VHN. There is also generally a compositional gradient or transition at the interface of the under layer and the adhesion promoting layer, which may range in thickness from 0.01 to 10 µm, or 0.05 to 9 µm, or 0.1 to 8 µm, or 0.5 to 5 µm.

The functional layer of the method of making a low friction coating disclosed herein may be made from a variety of different materials, including, but not limited to, a fullerene based composite, a diamond based material, diamondlike-carbon (DLC) and combinations thereof. Non-limiting exemplary diamond based materials include chemical vapor deposited (CVD) diamond or polycrystalline diamond compact (PDC). Non-limiting exemplary diamond-like-carbon include ta-C, ta-C:H, DLCH, PLCH, GLCH, Si-DLC, N-DLC, O-DLC, B-DLC, Me-DLC, F-DLC and combinations thereof. The thickness of the functional layer may range from 0.1 to 50 μm, or 0.2 to 40 μm, or 0.5 to 25 μm, or 1 to 20 μm, or 2 to 15 μm, or 5 to 10 μm. The functional layer may have a hardness that ranges from 1000 to 7500 VHN, or 1500 to 7000 VHN, or 2000 to 6500 VHN, or 2200 to 6000 VHN, or 2500 to 5500 VHN, or 3000 to 5000 VHN. The functional layer may have a surface roughness that ranges from 0.01 μm to 1.0 μm Ra, or 0.03 μm to 0.8 μm Ra, or 0.05 μm to 0.5 μm Ra, or 0.07 μm to 0.3 μm Ra, or 0.1 μm to 0.2 μm Ra. There is also generally a compositional gradient or transition at the interface of the adhesion promoting layer and the functional layer, which may range in thickness from 0.01 to 10 μm, or 0.05 to 9 μm, or 0.1 to 8 μm, or 0.5 to 5 μm.

The method of making a low friction coating described above may to further include depositing additional layers of adhesion promoting layer(s), functional layer(s) and optional under layer(s) (between functional layer(s) and adhesion promoting layer(s)) to further enhance the abrasion resistance, coefficient of friction and other properties of the multi-layer low friction coating. In another exemplary form, the method of making a low friction coating including an under layer contiguous with a surface of a substrate for coating, an adhesion promoting layer contiguous with a surface of the under layer, and a functional layer contiguous with a surface of the adhesion promoting layer may further include the step of depositing from 1 to 100 series of incremental coating layers, wherein each series of incremental coating layers includes a combination of an incremental adhesion promoting layer, an incremental functional layer and an optional incremental under layer, wherein the each series of incremental coating layers is configured as follows: A) the optional incremental under layer contiguous with a surface of the functional layer and the incremental adhesion promoting layer: wherein the optional incremental under layer is interposed between the functional layer and the incremental adhesion promoting layer; B) the incremental adhesion promoting layer contiguous with a surface of the functional layer or optional incremental under layer, and the incremental functional layer; and the incremental adhesion promoting layer is interposed between the functional layer and the incremental functional layer or between the optional incremental under layer and the incremental functional layer; and C) the incremental functional layer is contiguous with a surface of the incremental adhesion promoting layer.

The optional incremental under layer of the method of making a low friction coating disclosed herein may be made from a variety of different materials, including, but not limited to, CrN, TiN, TiAlN, TiAlVN, TiAlVCN, TiSiN, TiSiCN, TiAlSiN and combinations thereof. The thickness of the optional incremental under layer may range from 0.1 to 100 μm, or 2 to 75 μm, or 2 to 75 μm, or 3 to 50 μm, or 5 to 35 μm, or 10 to 25 μm. The optional incremental to under layer may have a hardness that ranges from 800 to 3500 VHN, or 1000 to 3300 VHN, or 1200 to 3000 VHN, or 1500 to 2500 VHN, or 1800 to 2200 VHN.

The incremental adhesion promoting layer of the method of making a low friction coating disclosed herein may be made from the following non-limiting exemplary materials: Cr, Ti, Si, W, CrC, TiC, SiC, WC, and combinations thereof. The thickness of the incremental adhesion promoting layer may range from 0 to 60 μm, or 0.1 to 50 μm, or 1 to 25 μm, or 2 to 20 μm, or 3 to 15 μm, or 5 to 10 μm. The incremental adhesion promoting layer may have a hardness that ranges from 200 to 2500 VHN, or 500 to 2000 VHN, or 800 to 1700 VHN, or 1000 to 1500 VHN. There is also generally a compositional gradient or transition at the interface of the optional incremental under layer and the incremental adhesion promoting layer, which may range in thickness from 0.01 to 10 μm, or 0.05 to 9 μm, or 0.1 to 8 μm, or 0.5 to 5 μm.

The incremental functional layer of the method of making a low friction coating disclosed herein may be made from a variety of different materials, including, but not limited to, a fullerene based composite, a diamond based material, diamond-like-carbon (DLC) and combinations thereof. Non-limiting exemplary diamond based materials include chemical vapor deposited (CVD) diamond or polycrystalline diamond compact (PDC). Non-limiting exemplary diamond-like-carbon include ta-C, ta-C:H, DLCH, PLCH, GLCH, Si-DLC, N-DLC, O-DLC, B-DLC, Me-DLC, F-DLC and combinations thereof. The thickness of the incremental functional layer may range from 0.1 to 50 μm, or 0.2 to 40 μm, or 0.5 to 25 μm, or 1 to 20 μm, or 2 to 15 μm, or 5 to 10 μm. The incremental functional layer may have a hardness that ranges from 1000 to 7500 VHN, or 1500 to 7000 VHN, or 2000 to 6500 VHN, or 2200 to 6000 VHN, or 2500 to 5500 VHN, or 3000 to 5000 VHN. The incremental functional layer may have a surface roughness that ranges from 0.01 μm to 1.0 μm Ra, or 0.03 μm to 0.8 μm Ra, or 0.05 μm to 0.5 μm Ra, or 0.07 μm to 0.3 μm Ra, or 0.1 μm to 0.2 μm Ra. There is also generally a compositional gradient or transition at the interface of the incremental adhesion promoting layer and the incremental functional layer, which may range in thickness from 0.01 to 10 μm, or 0.05 to 9 μm, or 0.1 to 8 μm, or 0.5 to 5 μm.

The method of making multi-layer low friction coatings of the present disclosure yield a coefficient of friction of the functional layer of the low friction coating as measured by the block on ring friction test is less than or equal to 0.15, or less than or equal to 0.12, or less than or equal to 0.10, or less than or equal to 0.08. The multi-layer low friction coating of the present disclosure yields a counterface wear scar depth as measured by the block on ring friction test of less than or equal to 500 μm, or less than or equal to 300 μm, or less than or equal to 100 μm, or less than or equal to 50 μm.

The method of making low friction coatings of the present disclosure also yields an unexpected improvement in abrasion resistance. The modified ASTM G105 abrasion test may be used to measure the abrasion resistance. In particular, the multi-layer low friction coatings of the present disclosure yield an abrasion resistance as measured by the modified ASTM G105 abrasion test for wear scar depth and weight loss that is at least 5 times lower, or at least 4 times lower, or at least 2 times lower than a single layer coating of the same functional layer. The multi-layer low friction coatings of the present disclosure yield a wear scar depth via the modified ASTM G105 abrasion test of less than or equal to 20 μm, or less than or equal to 15 μm, or less than or equal to 10 μm, or less than or equal to 5 μm, or less than or equal to 2 μm. The multi-layer low friction coatings of the present disclosure yield a weight loss via the modified ASTM G105 abrasion test of less than or equal to 0.03 grams, or less than or equal to 0.02 grams, or less than or equal to 0.01 grams, or less than or equal to 0.005 grams, or less than or equal to 0.004 grams, or less than or equal to 0.001 grams.

For the method of making low friction coatings of the present to disclosure, the steps of depositing the under layer(s), the adhesion promoting layer(s) and/or the functional layer(s) may be chosen from the following non-limiting exemplary methods: physical vapor deposition, plasma assisted chemical vapor deposition, and chemical vapor deposition. Non-limiting exemplary physical vapor deposition coating methods are magnetron sputtering, ion beam assisted deposition, cathodic arc deposition and pulsed laser deposition.

The method of making low friction coatings of the present disclosure may further include the step of post-processing step the outermost functional layer to achieve a surface roughness between 0.01 to 1.0 μm Ra, or 0.03 μm to 0.8 μm Ra, or 0.05 μm to 0.5 μm Ra, or 0.07 μm to 0.3 μm Ra, or 0.1 μm to 0.2 μm Ra. Non-limiting exemplary post-processing steps may include mechanical polishing, chemical polishing, depositing of smoothening layers, an ultra-fine super-polishing process, a tribochemical polishing process, an electrochemical polishing process, and combinations thereof.

The method of making low friction coatings of the present disclosure may be applied to the surface of various substrates for coating. Non-limiting exemplary substrates for the coating methods disclosed include steel, stainless steel, hardbanding, an iron alloy, an aluminum based alloy, a titanium based alloy, ceramics and a nickel based alloy. Non-limiting exemplary hardbanding materials include cermet based materials, metal matrix composites, nanocrystalline metallic alloys, amorphous alloys and hard metallic alloys. Other non-limiting exemplary types of hardbanding include carbides, nitrides, borides, and oxides of elemental tungsten, titanium, niobium, molybdenum, iron, chromium, and silicon dispersed within a metallic alloy matrix. Such hardbanding may be deposited by weld overlay, thermal spraying or laser/electron beam cladding. The thickness of hardbanding layer may range from several orders of magnitude times that of or equal to the thickness of the outer coating layer. Non-limiting exemplary hardbanding thicknesses are 1 mm, 2 mm, and 3 mm proud above the surface of the drill stem assembly. The hardbanding surface may have a patterned design to reduce entrainment of abrasive particles that contribute to wear. The multi-layer low friction coatings disclosed herein may be deposited on top of the hardbanding pattern. The hardbanding pattern may include both recessed and raised regions and the thickness variation in the hardbanding can be as much as its total thickness.

The method of making low friction coatings of the present disclosure may be applied to a portion of the surface of a device chosen from the following exemplary non-limiting types: a drill bit for subterraneous rotary drilling, a drill stem assembly for subterraneous rotary drilling, a casing, a tubing, couplings, a work string, a coiled tubing, a pipe, a riser, a plunger, centralizers, a completion string, a production string, and a petrochemical and chemical production device. In addition, the multi-layer low friction coating methods of the present disclosure may be applied to a portion of the surface of devices described in the definition section of the present disclosure.

Exemplary Method of Using Multi-layer Low Friction Coatings Embodiments:

The multi-layer low friction coatings disclosed herein may be applied to a portion of the surface of a device selected from the group consisting of a drill bit for subterraneous rotary drilling, a drill stem assembly for subterraneous rotary drilling, a casing, a tubing, couplings, a work string, a coiled tubing, a pipe, a riser, a plunger, centralizers, a completion string, a production string, and a petrochemical and chemical production device.

More particularly, the multi-layer low friction coatings disclosed herein may be used to improve the performance of drilling tools, particularly a drilling head for drilling in formations containing clay and similar substances. The present disclosure utilizes the low surface energy novel materials or coating systems to provide thermodynamically low energy surfaces, e.g., non-water wetting surface for bottom hole components. The multi-layer low friction to coatings disclosed herein are suitable for oil and gas drilling in gumbo-prone areas, such as in deep shale drilling with high clay contents using water-based muds (abbreviated herein as WBM) to prevent drill bit and bottom hole assembly component balling.

Furthermore, the multi-layer low friction coatings disclosed herein is when applied to the drill string assembly can simultaneously reduce contact friction, bit balling and reduce wear while not compromising the durability and mechanical integrity of casing in the cased hole situation. Thus, the multi-layer low friction coatings disclosed herein are "casing friendly" in that they do not degrade the life or functionality of the casing. The multi-layer low friction coatings disclosed herein are also characterized by low or no sensitivity to velocity weakening friction behavior. Thus, the drill stem assemblies provided with the multi-layer low friction coatings disclosed herein provide low friction surfaces with advantages in both mitigating stick-slip vibrations and reducing parasitic torque to further enable ultra-extended reach drilling.

The multi-layer low friction coatings disclosed herein for drill stem assemblies thus provide for the following exemplary non-limiting advantages: i) mitigating stick-slip vibrations, ii) reducing torque and drag for extending the reach of extended reach wells, and iii) mitigating drill bit and other bottom hole component balling. These three advantages together with minimizing the parasitic torque may lead to significant improvements in drilling rate of penetration as well as durability of downhole drilling equipment, thereby also contributing to reduced non-productive time (abbreviated herein as NPT). The multi-layer low friction coatings disclosed herein not only reduce friction, but also withstand the aggressive downhole drilling environments requiring chemical stability, corrosion resistance, impact resistance, durability against wear, erosion and mechanical integrity (coating-substrate interface strength). The multi-layer low friction coatings disclosed herein are also amenable for application to complex shapes without damaging the substrate properties. Moreover, the multi-layer low friction coatings disclosed herein also provide low energy surfaces necessary to provide resistance to balling of bottom hole components.

The body assembly or the coated drill stem assembly may include hardbanding on at least a portion of the exposed outer surface to provide enhanced wear resistance and durability. Drill stem assemblies experience significant wear at the hardbanded regions since these are primary contact points between drill stem and casing or open borehole. The wear can be exacerbated by abrasive sand and rock particles becoming entrained in the interface and abrading the surfaces. The coatings on the coated drill stem assembly disclosed herein show high hardness properties to help mitigate abrasive wear. Using hardbanding that has a surface with a patterned design may promote the flow of abrasive particles past the coated hardbanded region and reduce the amount of wear and damage to the coating and hardbanded portion of the component. Using coatings in conjunction with patterned hardbanding will further reduce wear due to abrasive particles.

Therefore, another aspect of the disclosure is the use of multi-layer low friction coatings on a hardbanding on at least a portion of the exposed outer surface of the body assembly, where the hardbanding surface has a patterned design that reduces entrainment of abrasive particles that contribute to wear. During drilling, abrasive sand and other rock particles suspended in drilling fluid can travel into the interface between the body assembly or drill string assembly and casing or open borehole. These abrasive particles, once entrained into this interface, contribute to the accelerated wear of the body assembly, drill string assembly, and casing. There is a need to extend equipment lifetime to maximize drilling and economic efficiency. Since hardbanding that is made proud above the surface of the body assembly or drill string assembly makes the most contact with the casing or open borehole, it experiences the most abrasive wear due to the entrainment of sand and rock particles. It is therefore advantageous to use hardbanding and multi-layer low friction coatings together to provide for wear protection and low friction. It is further advantageous to apply hardbanding in a patterned design wherein grooves between hardbanding material allow for the flow of particles past the hardbanded region without becoming entrained and abrading the interface. It is even further advantageous to reduce the contact area between hardbanding and casing or open borehole to mitigate sticking or balling by rock cuttings. The multi-layer low friction coatings could be applied in any arrangement, but preferably it would be applied to the entire area of the pattern since material passing through the passageways of the pattern would have reduced chance of sticking to the pipe.

An aspect of the present disclosure relates to an advantageous coated drill stem assembly for subterraneous rotary drilling operations comprising: a body assembly with an exposed outer surface including a drill string coupled to a bottom hole assembly, a coiled tubing coupled to a bottom hole assembly, or a casing string coupled to a bottom hole assembly, hardbanding on at least a portion of the exposed outer surface of the body assembly, where the hardbanding surface may or may not have a patterned design, a multi-layer low friction coating on at least a portion of the hardbanding, and one or more buttering layers interposed between the hardbanding and the multi-layer low friction coating.

A further aspect of the present disclosure relates to an advantageous method for reducing friction in a coated drill stem assembly during subterraneous rotary drilling operations comprising: providing a drill stem assembly comprising a body assembly with an exposed outer surface including a drill string coupled to a bottom hole assembly, a coiled tubing coupled to a bottom hole assembly, or a casing string coupled to a bottom hole assembly, hardbanding on at least a portion of the exposed outer surface of the body assembly, where the hardbanding surface may or may not have a patterned design, a multi-layer low friction coating on at least a portion of the hardbanding, and one or more buttering layers interposed between the hardbanding and the multi-layer low friction coating, and utilizing the coated drill stem assembly in subterraneous rotary drilling operations.

A still further aspect of the present disclosure relates to the interposition of one or more buttering layer(s) between the outer surface of the body assembly or hardbanding, and the multi-layer low friction coating. The buttering layer may be created or deposited as a result of one or more techniques including electrochemical or electroless plating methods, Plasma Vapor Deposition (PVD) or Plasma Assisted Chemical Vapor Deposition (PACVD) methods, carburizing, nitriding or boriding methods, or ultra-fine superpolishing methods. The buttering layer may be graded, and may serve several functional purposes, including but not limited to: decreased surface roughness, enhanced adhesion with other layer(s), enhanced mechanical integrity and performance.

A still further aspect of the present disclosure relates to the advantageous method of forming one or more buttering layer(s) interposed between the outer surface of the body assembly or hardbanding, and the multi-layer low friction coating. The buttering layer may be created or deposited as a result of one or more techniques including electrochemical or electroless plating methods, Plasma Vapor Deposition (PVD) or Plasma Assisted Chemical Vapor Deposition (PACVD) methods, carburizing, nitriding or boriding methods, or ultra-fine superpolishing methods. The buttering layer may be graded, and may serve several functional purposes, including but not limited to: decreased surface roughness, enhanced adhesion with other layer(s), enhanced mechanical integrity and performance.

In another embodiment, the buttering layer may be used in conjunction with hardbanding, where the hardbanding is on at least a portion of the exposed outer or inner surface to provide enhanced wear resistance and durability to the coated drill stem assembly, where the hardbanding surface may have a patterned design that reduces entrainment of abrasive particles that to contribute to wear. In addition, the multi-layer low friction coating may be deposited on top of the buttering layer.

Further Details Regarding Individual Layers and Interfaces

Further details regarding the functional layers for use in the multi-layer low friction coatings disclosed herein are as follows:

Fullerene Based Composites:

Fullerene based composite coating layers which include fullerene-like nanoparticles may also be used as the functional layer(s). Fullerene-like nanoparticles have advantageous tribological properties in comparison to typical metals while alleviating the shortcomings of conventional layered materials (e.g., graphite, $MoS_2$). Nearly spherical fullerenes may also behave as nanoscale ball bearings. The main favorable benefit of the hollow fullerene-like nanoparticles may be attributed to the following three effects, (a) rolling friction, (b) the fullerene nanoparticles function as spacers, which eliminate metal to metal contact between the asperities of the two mating metal surfaces, and (c) three body material transfer. Sliding/rolling of the fullerene-like nanoparticles in the interface between rubbing surfaces may be the main friction mechanism at low loads, when the shape of nanoparticle is preserved. The beneficial effect of fullerene-like nanoparticles increases with the load. Exfoliation of external sheets of fullerene-like nanoparticles was found to occur at high contact loads (~1 GPa). The transfer of delaminated fullerene-like nanoparticles appears to be the dominant friction mechanism at severe contact conditions. The mechanical and tribological properties of fullerene-like nanoparticles can be exploited by the incorporation of these particles in binder phases of coating layers. In addition, composite coatings incorporating fullerene-like nanoparticles in a metal binder phase (e.g., Ni—P electroless plating) can provide a film with self-lubricating and to excellent anti-sticking characteristics suitable for the functional layer of the multi-layer low friction coatings disclosed herein.

Super-Hard Materials (Diamond, Diamond-Like-Carbon):

Super-hard materials such as diamond, and diamond-like-carbon (DLC) may be used as the functional layer of the multi-layer low friction coatings disclosed herein. Diamond is the hardest material known to man and under certain conditions may yield low coefficient of friction when deposited by chemical vapor deposition (abbreviated herein as CVD).

In one advantageous embodiment, diamond-like-carbon (DLC) may be used as the functional layer of the multi-layer low friction coatings disclosed herein. DLC refers to amorphous carbon material that display some of the unique properties similar to that of natural diamond. Suitable diamond-like-carbon (DLC) layers or coatings may be chosen from ta-C, ta-C:H, DLCH, PLCH, GLCH, Si-DLC, titanium containing diamond-like-carbon (Ti-DLC), chromium containing diamond-like-carbon (Cr-DLC), Me-DLC, F-DLC, S-DLC, other DLC layer types, and combinations thereof. DLC coatings include significant amounts of $sp^3$ hybridized carbon atoms. These $sp^3$ bonds may occur not only with crystals—in other words, in solids with long-range order—but also in amorphous solids where the atoms are in a random arrangement. In this case there will be bonding only between a few individual atoms, that is short-range order, and not in a long-range order extending over a large number of atoms. The bond types have a considerable influence on the material properties of amorphous carbon films. If the $sp^2$ type is predominant the DLC film may be softer, whereas if $sp^3$ type is predominant, the DLC film may be harder.

DLC coatings may be fabricated as amorphous, flexible, and yet primarily $sp^3$ bonded "diamond". The hardest is such a mixture known as tetrahedral amorphous carbon, or ta-C. Such ta-C includes a high volume fraction (~80%) of $sp^3$ bonded carbon atoms. Optional fillers for the DLC coatings, include, but are not limited to, hydrogen, graphitic $sp^2$ carbon, and metals, and may be used in other forms to achieve a desired combination of properties depending on the particular application. The various forms of DLC coatings may be applied to a variety of substrates that are compatible with a vacuum environment and that are also electrically conductive. DLC coating quality is also dependent on the fractional content of alloying and/or doping elements such as hydrogen. Some DLC coating methods require hydrogen or methane as a precursor gas, and hence a considerable percentage of hydrogen may remain in the finished DLC material. In order to further improve their tribological and mechanical properties, DLC films are often modified by incorporating other alloying and/or doping elements. For instance, the addition of fluorine (F), and silicon (Si) to the DLC films lowers the surface energy and wettability. The reduction of surface energy in fluorinated DLC (F-DLC) is attributed to the presence of —CF2 and —CF3 groups in the film. However, higher F contents may lead to a lower hardness. The addition of Si may reduce surface energy by decreasing the dispersive component of surface energy. Si addition may also increase the hardness of the DLC films by promoting $sp^3$ hybridization in DLC films. Addition of metallic elements (e.g., W, Ta, Cr, Ti, Mo) to the film can reduce the compressive residual stresses resulting in better mechanical integrity of the film upon compressive loading.

The diamond-like phase or $sp^3$ bonded carbon of DLC is a thermodynamically metastable phase while graphite with $sp^2$ bonding is a thermodynamically stable phase. Thus the formation of DLC coating films requires non-equilibrium processing to obtain metastable $sp^3$ bonded carbon. Equilibrium processing methods such as evaporation of graphitic carbon, where the average energy of the evaporated species is low (close to kT where k is Boltzman's constant and T is temperature in absolute temperature scale), lead to the formation of 100% $sp^2$ bonded carbons. The methods disclosed herein for producing DLC coatings require that the carbon in the $sp^3$ bond length be to significantly less than the length of the $sp^2$ bond. Hence, the application of pressure, impact, catalysis, or some combination of these at the atomic scale may force $sp^2$ bonded carbon atoms closer together into $sp^3$ bonding. This may be done vigorously enough such that the atoms cannot simply spring back apart into separations characteristic of $sp^2$ bonds. Typical techniques either combine such a compression with a push of the new cluster of $sp^3$ bonded carbon deeper into the coating so that there is no room for expansion back to separations needed for $sp^2$ bonding; or the new cluster is buried by the arrival of new carbon destined for the next cycle of impacts.

The DLC coatings disclosed herein may be deposited by physical vapor deposition, chemical vapor deposition, or plasma assisted chemical vapor deposition coating techniques. The physical vapor deposition coating methods include RF-DC plasma reactive magnetron sputtering, ion beam assisted deposition, cathodic arc deposition and pulsed laser deposition (PLD). The chemical vapor deposition coating methods include ion beam assisted CVD deposition, plasma enhanced deposition using a glow discharge from hydrocarbon gas, using a radio frequency (r.f.) glow discharge from a hydrocarbon gas, plasma immersed ion processing and microwave discharge. Plasma enhanced chemical vapor deposition (PECVD) is one advantageous method for depositing DLC coatings on large areas at high deposition rates. Plasma-based CVD coating process is a non-line-of-sight technique, i.e. the plasma conformally covers the part to be coated and the entire exposed surface of the part is coated with uniform thickness. The surface finish of the part may be retained after the DLC coating application. One advantage of PECVD is that the temperature of the substrate part does not generally increase above about 150° C. during the coating operation.

The fluorine-containing DLC (F-DLC) and silicon-containing DLC (Si-DLC) films can be synthesized using plasma deposition technique using a process gas of acetylene ($C_2H_2$) mixed with fluorine-containing and silicon-containing precursor gases respectively (e.g., tetra-fluoro-ethane and hexa-methyl-disiloxane).

The DLC coatings disclosed herein may exhibit coefficients of friction within the ranges earlier described. The low COF may be based on the formation of a thin graphite film in the actual contact areas. As $sp^3$ bonding is a thermodynamically unstable phase of carbon at elevated temperatures of 600 to 1500° C., depending on the environmental conditions, it may transform to graphite is which may function as a solid lubricant. These high temperatures may occur as very short flash (referred to as the incipient temperature) temperatures in the asperity collisions or contacts. An alternative theory for the low COF of DLC coatings is the presence of hydrocarbon-based slippery film. The tetrahedral structure of a $sp^3$ bonded carbon may result in a situation at the surface where there may be one vacant electron coming out from the surface, that has no carbon atom to attach to, which is referred to as a "dangling bond" orbital. If one hydrogen atom with its own electron is put on such carbon atom, it may bond with the dangling bond orbital to form a two-electron covalent bond. When two such smooth surfaces with an outer layer of single hydrogen atoms slide over each other, shear will take place between the hydrogen atoms. There is no chemical bonding between the surfaces, only very weak van der Waals forces, and the surfaces exhibit the properties of a heavy hydrocarbon wax. Carbon atoms at the surface may make three strong bonds leaving one electron in the dangling bond orbital pointing out from the surface. Hydrogen atoms attach to such surface which becomes hydrophobic and exhibits low friction.

The DLC coatings for the functional layer of the multi-layer low friction coatings disclosed herein also prevent wear due to their tribological properties. In particular, the DLC coatings disclosed herein demonstrate enhanced resistance to wear and abrasion making them suitable for use in applications that experience extreme contact pressure and severe abrasive environments.

Buttering Layers:

In yet another embodiment of the multi-layer low friction coatings herein, the device may further include one or more buttering layers interposed between the outer surface of the body assembly or hardbanding layer and the layers comprising the multi-layer low friction coating on at least a portion of the exposed outer surface.

In one embodiment of the nickel based alloy used as a buttering layer, the layer may be formed by electroplating. Electro-plated nickel may be deposited as a buttering layer with tailored hardness ranging from 150-1100, or 200 to 1000, or 250 to 900, or 300 to 700 Hv. Nickel is a silver-white metal, and therefore the appearance of the nickel based alloy buttering layer may range from a dull gray to an almost white, bright finish. In one form of the nickel alloy buttering layers disclosed herein, sulfamate nickel may be deposited from a nickel sulfamate bath using electoplating. In another form of the nickel alloy buttering layers disclosed herein, watts nickel may be deposited from a nickel sulfate bath. Watts nickel normally yields a brighter finish than does sulfamate nickel since even the dull watts bath contains a grain refiner to improve the deposit. Watts nickel may also be deposited as a semi-bright finish. Semi-bright watts nickel achieves a brighter deposit because the bath contains organic and/or metallic brighteners. The brighteners in a watts bath level the deposit, yielding a smoother surface than the underlying part. The semi-bright watts deposit can be easily polished to an ultra smooth surface with high luster. A bright nickel bath contains a higher concentration of organic brighteners that have a leveling effect on the deposit. Sulfur-based brighteners are normally used to achieve leveling in the early deposits, and a sulfur-free organic, such as formaldehyde, is used to achieve a fully bright deposit as the plating layer thickens. In another form, the nickel alloy used for the buttering layer may be formed from black nickel, which is often applied over an under plating of electrolytic or electroless nickel. Among the advantageous properties afforded by a nickel based buttering layer, include, but are not limited to, corrosion prevention, magnetic properties, smooth surface finish, appearance, lubricity, hardness, reflectivity, and emissivity.

In another embodiment, the nickel based alloy used as a buttering layer may be formed as an electroless nickel plating. In this form, the electroless nickel plating is an autocatalytic process and does not use externally applied electrical current to produce the deposit. The electroless process deposits a uniform coating of metal, regardless of the shape of the part or its surface irregularities; therefore, it overcomes one of the major drawbacks of electroplating, the variation in plating thickness that results from the variation in current density caused by the geometry of the plated part and its relationship to the plating anode. An electroless plating solution produces a deposit wherever it contacts a properly prepared surface, without the need for conforming anodes and complicated fixtures. Since the chemical bath maintains a uniform deposition rate, the plater can precisely control deposit thickness simply by controlling immersion time. Low-phosphorus electroless nickel used as a buttering layer may yield the brightest and hardest deposits. Hardness ranges from 60-70 $R_C$ (or 697 Hv~1076 Hv). In another form, medium-phosphorus or mid-phos may be used as a buttering layer, which has a hardness of approximately 40-42 $R_C$ (or 392 Hv~412 Hv). Hardness may be improved by heat-treating into the 60-62 $R_C$ (or 697 Hv~746 Hv) range. Porosity is lower, and conversely corrosion resistance is higher than low-phosphorous electroless nickel. High-phosphorous electroless nickel is dense and dull in comparison to the mid and low-phosphorus deposits. High-phosphorus exhibits the best corrosion resistance of the electroless nickel family; however, the deposit is not as hard as the lower phosphorus content form. High-phosphorus electroless nickel is a virtually non-magnetic coating. For the nickel alloy buttering layers disclosed herein, nickel boron may be used as an underplate for metals that require firing for adhesion. The NiP amorphous matrix may also include a dispersed second phase. Non-limiting exemplary dispersed second phases include: i) electroless NiP matrix incorporated fine nano size second phase particles of diamond, ii) electroless NiP matrix with hexagonal boron nitride particles dispersed within the matrix, and iii) electroless NiP matrix with submicron PTFE particles (e.g. 20-25% by volume Teflon) uniformly dispersed throughout coating.

In yet another embodiment, the buttering layer may be formed of an electroplated chrome layer to produce a smooth and reflective surface finish. Hard chromium or functional chromium plating buttering layers provide high hardness that is in the range of 700 to 1,000, or 750 to 950, or 800 to 900 Hv, have a bright and smooth surface finish, and are resistant to corrosion with thicknesses ranging from 20 µm to 250, or 50 to 200, or 100 to 150 µm. Chromium plating buttering layers may be easily applied at low cost. In another form of this embodiment, a decorative chromium plating may be used as a buttering layer to provide a durable coating with smooth surface finish. The decorative chrome buttering layer may be deposited in a thickness range of 0.1 µm to 0.5 µm, or 0.15 µm to 0.45 µm, or 0.2 µm to 0.4 µm, or 0.25 µm to 0.35 µm. The decorative chrome buttering layer may also be applied over a bright nickel plating.

In still yet another embodiment, the buttering layer may be formed on the body assembly or hardbanding from a super-polishing process, which removes machining/grinding grooves and provides for a surface finish below 0.25 µm average surface roughness (Ra).

In still yet another embodiment, the buttering layer may be formed on the body assembly or hardbanding by one or more of the following non-limiting exemplary processes: PVD, PACVD, CVD, ion implantation, carburizing, nitriding, boronizing, sulfiding, siliciding, oxidizing, an electrochemical process, an electroless plating process, a thermal spray process, a kinetic spray process, a laser-based process, a friction-stir process, a shot peening process, a laser shock peening process, a welding process, a brazing process, an ultra-fine to superpolishing process, a tribochemical polishing process, an electrochemical polishing process, and combinations thereof.

Interfaces:

The interfaces between various layers in the coating may have a substantial impact on the performance and durability of the coating. In particular, non-graded interfaces may create sources of weaknesses including one or more of the following: stress concentrations, voids, residual stresses, spallation, delamination, fatigue cracking, poor adhesion, chemical incompatibility, mechanical incompatibility. One non-limiting exemplary way to improve the performance of the coating is to use graded interfaces.

Graded interfaces allow for a gradual change in the material and physical properties between layers, which reduces the concentration of sources of weakness. One non-limiting exemplary way to create a graded interface during a manufacturing process is to gradually stop the processing of a first layer while simultaneously gradually commencing the processing of a second layer. The thickness of the graded interface can be optimized by varying the rate of change of processing conditions. The thickness of the graded interface may range from 0.01 to 10 µm, or 0.05 to 9 µm, or 0.1 to 8 µm, or 0.5 to 5 µm. Alternatively the thickness of the graded interface may range from 5% to 95% of the thickness of the thinnest adjacent layer.

TEST METHODS

High-Sand CETR Block-on-Ring Test:

This test was designed to simulate a high load (i.e., high contact pressure) and high abrasion environment. Ring specimens were rotated at various speeds and loads against a 6.36 mm wide steel block (hardness ~300-350 Hv) at ambient temperature. The steel counterface was translated at a reciprocating speed of 1 mm/s perpendicular to the axis of the rotation of the ring in order to to maintain uniformity in wear across the ring. The lubricating medium used for this study consisted of an oil-based slurry (Oil:Water=1:9) where water was used as a continuous phase. A poly-alpha-olefin oil of viscosity 8 cSt at 100° C. was used. This made the emulsion viscosity approximately 0.009 Pa·S at the test temperature which is comparable to the viscosity of a typical oil based mud under is similar conditions. The slurry contained 50 wt. % sand (silica) of 150 µm mean diameter. The slurry was introduced into a containing chamber into which the ring was partially immersed for the duration of the test. The sand was fully homogenized in the lubricating medium prior to the test by introducing the slurry (in a sealed container) in a magnetic stirrer for 30 minutes. The rotation of the ring prevented the sedimentation of particles in the reservoir during the test. The friction coefficient values during each wear test were recorded automatically by a computer. The block wear (scar depth) was measured by scanning the wear track in a stylus profilometer while the coating wear was estimated based on the visual inspection. The block wear was used as the measure of counterface friendliness for any given coating. It should be noted that all coatings yielded low coefficient of friction (typically <0.1), as long the DLC remained intact during the CETR-BOR test.

Modified ASTM G105 Abrasion Test:

This is a wet sand/rubber wheel abrasion test designed to simulate a lower load and very severe abrasion environment. The standard ASTM G105 test is run using rubber wheels of four different Shore hardness. However, in order to avoid complexity, the ASTM G105 test was modified for this study where the specimen was tested in contact against a rotating rubber wheel of given shore hardness (A 58-62). Tests were run in a Falex wear tester keeping the rubber wheel partially submerged in a mixture of sand and water. The wheel was rotated at 200 rpm for 30 minutes against a vertically placed flat test specimen (1"X3") to under 301 bf load. The diameter and width of the wheel was 9" and 0.5" respectively. The slurry contained 60% $SiO_2$ sand (round) and 40% water. At the completion of the tests, specimens have been investigated for coating durability and performance determined by (a) residual coating on plate (visual examination—percent of wear zone covered by top layer coating after test), (b) mass loss, (c) profilometry to measure wear scar depth and (d) microscopy. Reported wear scar depth is the maximum depth of the wear groove measured by scanning the stylus along the length of the wear track created by the rubber wheel through the middle of the wear zone width.

EXAMPLES

Illustrative Example 1

The two steps as outlined below were used to improve coating durability in severe abrasive/loading conditions.

Step 1: Thick/Superthick Underlayer Structures:

Deposition of the DLC and adhesion promoting layers can be done through a process such as PACVD, where a source and/or target is used to deposit the DLC layer and the underlayer (e.g., $Cr_xN$, $Ti_xN$ etc.). In some cases, the DLC layer (usually 1-5 µm) is deposited directly onto a substrate without any underlayer. In other cases, an underlayer (typically 2-5 µm) is deposited onto the substrate before DLC deposition (on the underlayer). The underlayer provides some mechanical integrity and toughness through load shielding while also providing some adhesion enhancement with the substrate. Generally, lower underlayer thicknesses help to improve overall coating performance in less severe conditions (e.g., low abrasion/load), the coating durability remains very poor under conditions where high abrasion/loads are encountered, mainly due to the to plastic deformation of the substrate and abrasive wear of the DLC itself.

Finite Element Analysis (FEA) indicates that the transmission of loads through sand grains can initiate significant deformation of the underlying substrate at indentation depths of <1 µm, which is possible under high-load operating conditions. In fact, with larger sand grains (~25-50 µm), the level of substrate plastic deformation (locally) can be quite high (>10%), leading to delamination and cracking of coating near the underlayer/substrate interface. Furthermore, the plastic deformation in the substrate can change the stress state in the underlayer/DLC interface, further reducing the load-bearing capacity of the DLC coating. The delamination/cracking of the coating is accelerated by the high compressive residual stress within the DLC coating which creates a complex local stress state conducive to coating removal (debonding).

By systematically increasing the underlayer thickness (to ≥10-15 µm), a more effective load-shielding layer can be created, thus significantly minimizing plastic deformation of the substrate. Experiments and abrasion test results (discussed below) illustrate the beneficial effect on coating durability as a function of increasing underlayer (CrN) thickness. The deposition of such thick underlayers is a technically challenging process, and may require a good control of stoichiometry (e.g., alternating CrN and $Cr_2N$ layers to manage residual stress) longer deposition times (typical deposition rates for CrN: 1 µm per 40-50 minutes).

Step 2: Thick/Superthick, Superhard and/or Composite DLC Structures:

While Step 1 (above) helps minimize plastic deformation of the substrate, it does not directly address the issue of DLC performance (i.e., durability) in severe abrasive conditions.

In wear involving an abrading medium (i.e., sand), the ratio of the hardness of the abrading medium and coating (i.e. surface being abraded) determines overall abrasion rate (according to the open literature). Under this to premise, increasing coating hardness can help reduce abrasive wear.

However, increased hardness of DLC coatings comes at the expense of increasing residual stress, which causes issues with coating cracking/delamination/spalling. Thus, this aspect leads to a focus on "optimal" hardness as opposed to "extreme" hardness. Our experiments indicate that hardness values of 2500-5500 (Hv) can be targeted, in combination with effective underlayer thicknesses, while not compromising coating durability (through cracking/spalling) severely for the thicker coating architectures.

Given a coating hardness, which in turn determines abrasion rate (assuming a gradual abrasion mechanism dominates as opposed to coating cracking/spalling), the overall durability of the coating depends on the coating thickness. By systematically increasing the thickness of the DLC layer (to values >15 μm), it has been shown that the coating durability can be improved in severe abrasive/loading conditions (discussed below). The deposition of such DLC resistance of such a multilayer are also presented (below). Alternatively, to a combination of a harder functional layer (e.g., ta-C) with a targeted thickness of underlayer (such as CrN), may also yield superior abrasion resistance along with improved toughness and durability of the coating.

Results Summarizing the Combined Benefits of Step 1 and Step 2:

Table 1 below shows a summary of nine different coating architectures tested to evaluate the effect of the approaches/steps outlined above (in some cases, values of adhesion promoting layer thicknesses are not explicitly reported). Two types of tests/experiments were designed and conducted to evaluate coating durability: CETR block on ring (high sand) test, and modified ASTM G105 test. These tests, and associated measurements from each are described above.

TABLE 1

Summary of coating architectures and test results

| # | Coating | Description | CETR Block wear scar depth (μm) | Residual coating after CETR test (%) | ASTM G105 weight loss (g) | ASTM G105 max. scar depth (μm)* | ASTM G105 % DLC intact after test |
|---|---|---|---|---|---|---|---|
| A | Thin coating | 2 μm CrN + 1 μm DLC | ~450 | <15 | 0.0516 | 2.7 | 0 |
| B | Moderate DLC thickness | 2 μm CrN + 5 μm DLC | ~50 | ~50 | 0.0406 | 25 | 0 |
|   |   | 5 μm CrN + 5 μm DLC | ~60 | >70 | 0.0083 | ~6-8 | 30 |
| C | Thick underlayer | 10 μm CrN + 5 μm DLC | ~150 | >80 | 0.0058 | ~8 | 0 |
| D | Thick underlayer + thick DLC | 15 μm CrN + 10 μm DLC | ~200 | >90 | 0.0041 | ~10 | 40 |
| E | Thick underlayer + Thick multilayer DLC) | 15 μm CrN + 10 μm Multilayer (CrC/DLC) | ~100 | >95 | 0.0028 | ~9 | 60 |
| F | Thick underlayer + Thick ta-C | 15 μm CrN + 6 μm ta-C | ~640 | >90 | 0.0008 | 0 | 100 |
| G | Thick underlayer + Thick multilayer + Thick DLC | 15 μm CrN + 15 μm CrC + 15 μm DLC | ~320 | >95 | 0.0065 | ~2 | 60 |
| H | taC/graded DLC | Thin Cr + 2 μm ta-C + 4 μm DLC | ~170 | >90 | 0.0237 | ~29 | 0 |
| I | Thick underlayer + taC/graded DLC | 7 μm CrN + 2 μm taC + 5 μm graded DLC | ~171 | >95 | 0.0016 | ~4 | >80 | layers is a technically challenging process requiring good control over interlayer adhesion (where applicable) and chemistry, management of residual stress, and process control to avoid chamber contamination, while requiring long deposition times (typical DLC deposition rates: 1 μm for every 80-100 minutes). In some cases, the beneficial effects of using harder functional layers such as ta-C, in combination with thicker underlayers and adhesion promoting layers, can also be realized.

The intrinsic abrasion resistance of the DLC depends upon the coating chemistry. A multilayer of a-C:H alternating with CrC can be created to enhance overall intrinsic toughness and abrasion resistance of the multilayer. The a-C:H phase is essential to provide the low friction properties, while the CrC phase provides toughness and higher resistance to abrasion. Results indicating superior abrasion FIG. 1 illustrates microscopy investigations on some selective coatings (A-F from Table 1). Indications of a good coating performance and durability are: low block wear (i.e., good casing friendliness), high % of residual coating after CETR-BOR or ASTM test (i.e. good coating durability in high-load abrasive test), low weight loss and scar depth in ASTM G105 test (i.e. minimal coating removal and/or substrate removal during test).

The beneficial effects of (a) thick underlayers, (b) thick and multilayer composite DLC structures, and (c) superhard top layer coatings are apparent from the results presented in this study. The cumulative effects of these approaches may yield a coating architecture (e.g., similar to architecture E, F) with the significantly improved overall durability among the evaluated specimens, in test conditions designed to simulate high loading/abrasion environments. When using weight loss in ASTM tests as a measure, it can be seen that Architecture E (thick underlayer+thick multilayer DLC) is approximately 20 times better than Architecture A (thin DLC) In addition, architecture F (thick underlayer+thick ta-C) is approximately 70-100 times better than Architecture A (thin DLC) in terms of overall durability as measured by resistance to wear/abrasion in the G105 test. The significant improvement in abrasion resistance using thick underlayer and thick coating was also apparent for the superhard ta-C coating (Architecture I vs. Architecture H).

Applicants have attempted to disclose all embodiments and applications of the disclosed subject matter that could be reasonably foreseen. However, there may be unforeseeable, insubstantial modifications that remain as equivalents. While the present disclosure has been described in conjunction with specific, exemplary embodiments thereof, it is evident that many alterations, modifications, and variations will be apparent to those skilled in the art in light of the foregoing description without departing from the spirit or scope of the present disclosure. Accordingly, the present disclosure is intended to embrace all such alterations, modifications, and variations of the above detailed description.

All patents, test procedures, and other documents cited herein, including priority documents, are fully incorporated by reference to the extent such disclosure is not inconsistent with this disclosure and for all jurisdictions in which such incorporation is permitted.

When numerical lower limits and numerical upper limits are listed herein, ranges from any lower limit to any upper limit are contemplated.

What is claimed is:

1. A multi-layer low friction coating comprising:
   i) an under layer comprising CrN, wherein the under layer ranges in thickness from 5 to 15 µm,
   ii) an optional adhesion promoting layer comprising CrC, wherein the adhesion promoting layer ranges in thickness from 5 to 15 µm and is contiguous with a surface of the under layer, and
   iii) a functional layer comprising diamond-like-carbon (DLC), wherein the functional layer ranges from 5 to 15 µm and is contiguous with a surface of the optional adhesion promoting layer or a surface of the under layer, and wherein the diamond-like-carbon (DLC) is selected from the group consisting of ta-C, DLCH, and combinations thereof,
   wherein the optional adhesion promoting layer is interposed between the under layer and the functional layer,
   wherein the coefficient of friction of the functional layer of the low friction coating as measured by the block on ring friction test is less than or equal to 0.15, and
   wherein the abrasion resistance of the low friction coating as measured by the modified ASTM G105 abrasion test yields a wear scar depth of less than or equal to 20 µm and a weight loss less than or equal to 0.02 grams.

2. The coating of claim 1, wherein the under layer is contiguous with a surface of a substrate.

3. The coating of claim 2, wherein the substrate is selected from the group consisting of steel, stainless steel, hardbanding, an iron alloy, an aluminum based alloy, a titanium based alloy, ceramics and a nickel based alloy.

4. The coating of claim 3, wherein the hardbanding comprises a cermet based material, a metal matrix composite or a hard metallic alloy.

5. The coating of claim 1, wherein the under layer hardness ranges from 800 to 3500 VHN.

6. The coating of claim 1, wherein the adhesion promoting layer hardness ranges from 200 to 2500 VHN.

7. The coating of claim 1, wherein the functional layer hardness ranges from 1000 to 7500 VHN.

8. The coating of claim 1, wherein the adhesion promoting layer is present, the coating further including a gradient at the interface of the under layer and the adhesion promoting layer ranging from 0.01 to 10 µm.

9. The coating of claim 1, wherein the adhesion promoting layer is present, the coating further including a gradient at the interface of the adhesion promoting layer and the functional layer ranging from 0.01 to 10 µm.

10. The coating of claim 1, wherein the adhesion promoting layer is present, the coating further including a second adhesion promoting layer comprising CrC, wherein the second adhesion promoting layer ranges in thickness from 0.1 to 2 µm and is contiguous with a surface of the functional layer, and a second functional layer comprising diamond-like-carbon (DLC), wherein the second functional layer ranges from 0.1 to 2 µm and is contiguous with a surface of the second adhesion promoting layer.

11. The coating of claim 10, wherein the diamond-like-carbon (DLC) is selected from the group consisting of ta-C, DLCH, and combinations thereof.

12. The coating of claim 1, wherein the surface roughness of the functional layer ranges from 0.01 µm to 1.0 µm Ra.

13. The coating of claim 1, wherein the abrasion resistance of the low friction coating as measured by the modified ASTM G105 abrasion test yields a wear scar depth and a weight loss at least 5 times lower than a single layer coating of the same functional layer.

14. The coating of claim 1, wherein the coating is applied to a portion of the surface of a device selected from the group consisting of a drill bit for subterranean rotary drilling, a drill stem assembly for subterranean rotary drilling, a casing, a tubing, couplings, a work string, a coiled tubing, a pipe, a riser, a plunger, centralizers, a completion string, a production string, and a petrochemical and chemical production device.

15. A method of making a multi-layer low friction coating comprising:
   i) providing a substrate for coating,
   ii) depositing on a surface of the substrate an under layer comprising CrN, wherein the under layer ranges in thickness from 5 to 15 µm,
   iii) depositing optionally on the surface of the under layer an adhesion promoting layer comprising CrC, wherein the adhesion promoting layer ranges in thickness from 5 to 15 µm and is contiguous with a surface of the under layer, and
   iv) depositing on the surface of the optional adhesion promoting layer or on the surface of the under layer a functional layer comprising diamond-like-carbon (DLC), wherein the functional layer ranges from 5 to 15 µm and is contiguous with a surface of the optional adhesion promoting layer or a surface of the under layer, and wherein the diamond-like-carbon (DLC) is selected from the group consisting of ta-C, DLCH, and combinations thereof,
   wherein the coefficient of friction of the functional layer of the low friction coating as measured by the block on ring friction test is less than or equal to 0.15, and
   wherein the abrasion resistance of the low friction coating as measured by the modified ASTM G105 abrasion test yields a wear scar depth of less than or equal to 20 µm and a weight loss less than or equal to 0.02 grams.

16. The method of claim 15, further including depositing from 1 to 100 series of incremental coating layers, wherein each series of incremental coating layers includes a combination of an incremental adhesion promoting layer, an incremental functional layer and an optional incremental under layer, wherein the each series of incremental coating layers is configured as follows:

(i) wherein the optional incremental under layer is selected from the group consisting of CrN, TiN, TiAlN, TiAlVN, TiAlVCN, TiSiN, TiSiCN, TiAlSiN and combinations thereof; ranges in thickness from 0.1 to 100 µm; and is contiguous with a surface of the functional layer and the incremental adhesion promoting layer; wherein the optional incremental under layer is interposed between the functional layer and the incremental adhesion promoting layer, (ii) wherein the incremental adhesion promoting layer is selected from the group consisting of Cr, Ti, Si, W, CrC, TiC, SiC, WC, and combinations thereof; ranges in thickness from 0.1 to 50 µm; and is contiguous with a surface of the functional layer or optional incremental under layer, and the incremental functional layer; wherein the incremental adhesion promoting layer is interposed between the functional layer and the incremental functional layer or between the optional incremental under layer and the incremental functional layer (iii) wherein the incremental functional layer is selected from the group consisting of a fullerene based composite, a diamond based material, diamond-like-carbon (DLC), and combinations thereof; ranges from 0.1 to 50 µm in thickness; and is contiguous with a surface of the incremental adhesion promoting layer.

17. The method of claim 15, wherein the substrate is selected from the group consisting of steel, stainless steel, hardbanding, an iron alloy, an aluminum based alloy, a titanium based alloy, ceramics and a nickel based alloy.

18. The method of claim 17, wherein the hardbanding comprises a cermet based material, a metal matrix composite or a hard metallic alloy.

19. The method of claim 15, wherein the under layer hardness ranges from 800 to 3500 VHN.

20. The method of claim 15, wherein the adhesion promoting layer hardness ranges from 200 to 2500 VHN.

21. The method of claim 15, wherein the functional layer hardness ranges from 1000 to 7500 VHN.

22. The method of claim 15, further including a gradient at the interface of the under layer and the adhesion promoting layer ranging from 0.01 to 10 µm.

23. The method of claim 15, further including a gradient at the interface of the adhesion promoting layer and the functional layer ranging from 0.01 to 10 µm.

24. The method of claim 16, wherein the incremental functional layer is diamond-like-carbon (DLC).

25. The method of claim 24, wherein the diamond-like-carbon (DLC) is selected from the group consisting of ta-C, ta-C:H, DLCH, PLCH, GLCH, Si-DLC, N-DLC, O-DLC, B-DLC, Me-DLC, F-DLC and combinations thereof.

26. The method of claim 16, wherein the optional incremental under layer hardness ranges from 800 to 3500 VHN.

27. The method of claim 16, wherein the incremental adhesion promoting layer hardness ranges from 200 to 2500 VHN.

28. The method of claim 16, wherein the incremental functional layer hardness ranges from 1000 to 7500 VHN.

29. The method of claim 16, further including a gradient at the interface of the optional incremental under layer and the incremental adhesion promoting layer ranging from 0.01 to 10 µm.

30. The method of claim 16, further including a gradient at the interface of the incremental adhesion promoting layer and the incremental functional layer ranging from 0.01 to 10 µm.

31. The method of claim 15, wherein the surface roughness of the functional layer ranges from 0.01 µm to 1.0 µm Ra.

32. The method of claim 16, wherein the surface roughness of the outermost incremental functional layer ranges from 0.01 µm to 1.0 µm Ra.

33. The method of claim 15, wherein the counterface wear scar depth as measured by the block on ring friction test is less than or equal to 500 µm.

34. The method of claim 15, wherein the abrasion resistance of the low friction coating as measured by the modified ASTM G105 abrasion test yields a wear scar depth and a weight loss at least 5 times lower than a single layer coating of the same functional layer.

35. The method of claim 15 or 16, wherein the substrate is a portion of the surface of a device selected from the group consisting of a drill bit for subterraneous rotary drilling, a drill stem assembly for subterraneous rotary drilling, a casing, a tubing, couplings, a work string, a coiled tubing, a pipe, a riser, a plunger, centralizers, a completion string, a production string, and a petrochemical and chemical production device.

36. The method of claim 15, wherein the steps of depositing the under layer, depositing the adhesion promoting layer or depositing the functional layer are selected from the group consisting of physical vapor deposition, plasma assisted chemical vapor deposition, and chemical vapor deposition.

37. The method of claim 36, wherein the physical vapor deposition coating method is selected from the group consisting of magnetron sputtering, ion beam assisted deposition, cathodic arc deposition and pulsed laser deposition.

38. The method of claim 15, further including a post-processing step on the functional layer to achieve a surface roughness between 0.01 to 1.0 µm Ra.

39. The method of claim 38, wherein the post-processing step is selected from the group consisting of mechanical polishing, chemical polishing, depositing of smoothening layers, an ultra-fine superpolishing process, a tribochemical polishing process, an electrochemical polishing process, and combinations thereof.

* * * * *